US009778283B2

(12) United States Patent
Kikuchi

(10) Patent No.: US 9,778,283 B2
(45) Date of Patent: Oct. 3, 2017

(54) ELECTRONIC COMPONENT HANDLING APPARATUS, ELECTRONIC COMPONENT TESTING APPARATUS, AND ELECTRONIC COMPONENT TESTING METHOD

(71) Applicant: ADVANTEST CORPORATION, Tokyo (JP)

(72) Inventor: Aritomo Kikuchi, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 911 days.

(21) Appl. No.: 14/058,876

(22) Filed: Oct. 21, 2013

(65) Prior Publication Data

US 2014/0111235 A1    Apr. 24, 2014

(30) Foreign Application Priority Data

Oct. 24, 2012    (JP) .................................. 2012-234440

(51) Int. Cl.
| | |
|---|---|
| G01R 31/00 | (2006.01) |
| H04N 7/18 | (2006.01) |
| G01R 1/02 | (2006.01) |
| G01R 31/28 | (2006.01) |

(52) U.S. Cl.
CPC ........... *G01R 1/02* (2013.01); *G01R 31/2893* (2013.01); *G01R 31/2891* (2013.01)

(58) Field of Classification Search
CPC ... G01R 1/02; G01R 31/2893; G01R 31/2891
USPC ........................ 324/750.03, 750.23; 348/126
See application file for complete search history.

(56) References Cited

U.S. PATENT DOCUMENTS

| | | | |
|---|---|---|---|
| 5,523,678 A | 6/1996 | Mitsui | |
| 7,859,248 B2 | 12/2010 | Kaneko | |
| 2005/0151551 A1 | 7/2005 | Okuda et al. | |
| 2011/0254945 A1* | 10/2011 | Kikuchi | G01R 31/2893 |
| | | | 348/126 |
| 2013/0168203 A1 | 7/2013 | Nakajima et al. | |

FOREIGN PATENT DOCUMENTS

| | | |
|---|---|---|
| JP | 06-249915 | 9/1994 |
| JP | 2011-226806 | 11/2011 |
| TW | I228599 | 3/2005 |
| WO | 03/075023 | 12/2003 |

OTHER PUBLICATIONS

Taiwan Office action, dated May 25, 2015.

* cited by examiner

*Primary Examiner* — Farhana Hoque
(74) *Attorney, Agent, or Firm* — Greenblum & Bernstein, P.L.C.

(57) ABSTRACT

There is provided an electronic component handling apparatus which can be reduced in size or can improve the throughput when the number of contact arms is increased. A handler comprises: a plurality of contact arms which are arrayed along a first direction, each of the plurality of contact arms including a holding part which holds a DUT and including an adjustment unit which moves the holding part relative to a base part of each contact arm; an imaging unit capable of imaging the DUT and the holding part; an operation unit which operates the adjustment unit; and a moving unit which moves the imaging unit and the operation unit along an X direction. The adjustment unit adjusts the relative position of the holding part according to an operation of the operation unit.

14 Claims, 17 Drawing Sheets

F I G. 1 0 A
(a)
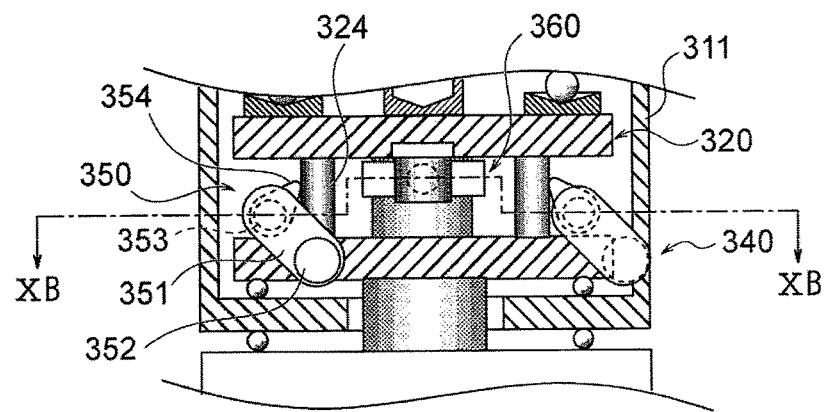
F I G. 1 0 B
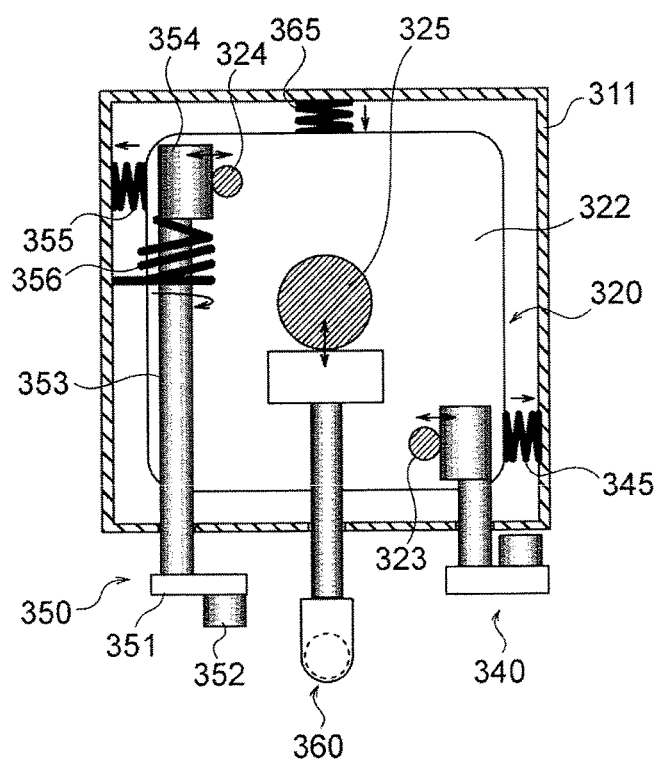

ELECTRONIC COMPONENT HANDLING APPARATUS, ELECTRONIC COMPONENT TESTING APPARATUS, AND ELECTRONIC COMPONENT TESTING METHOD

BACKGROUND OF THE INVENTION

1. Field of the Invention

The present invention relates to an electronic component handling apparatus for positioning an electronic component under test (hereinafter, simply referred to as a device under test (DUT)), such as a semiconductor integrated circuit device, using an image processing technology, an electronic component testing apparatus including the electronic component handling apparatus, and an electronic component testing method using the electronic component handling apparatus.

The present application claims priority from Japanese Patent Application No. 2012-234440 filed on Oct. 24, 2012. The contents described and/or illustrated in the documents relevant to the Japanese Patent Application No. 2012-234440 will be incorporated herein by reference as a part of the description and/or drawings of the present application.

2. Description of the Related Art

An electronic component testing apparatus for positioning a DUT using an image processing technology is known (for example, refer to WO 03/075023 and JP 2011-226806 A). In such an electronic component testing apparatus, the position of a DUT is recognized using a camera and then the positioning of the DUT is performed by an alignment device.

In the electronic component testing apparatus described above, the work of DUT position recognition and positioning is separately repeated with respect to each contact arm. For this reason, if the number of contact arms (that is, the number of simultaneous measurements) is increased, there is a problem in that the working time required for alignment becomes longer unless more alignment devices are added.

SUMMARY OF THE INVENTION

In order to solve the above-described problem, it is an object of the invention to provide an electronic component handling apparatus that can be reduced in size or can improve the throughput when the number of contact arms is increased, an electronic component testing apparatus, and an electronic component testing method.

<1> An electronic component handling apparatus according to the invention is an electronic component handling apparatus comprising: a plurality of contact arms which are arrayed along a first direction, each of the plurality of contact arms including a holding part which holds an electronic component and including an adjustment unit which moves the holding part relative to a base part of each of the plurality of contact arm; an imaging unit which images at least one of the electronic component and the holding part; a first moving device which moves the imaging unit along the first direction; an operation unit which operates the adjustment unit; and a second moving device which moves the operation unit along the first direction, wherein the adjustment unit adjusts a relative position of the holding part with respect to the base part according to an operation of the operation unit.

<2> In the invention described above, the electronic component handling apparatus may further comprise a calculation device which calculates a relative movement amount of the holding part with respect to the base part on the basis of image information imaged by the imaging unit, and the operation unit may operate the adjustment unit to move the holding part by the relative movement amount.

<3> In the invention described above, the first moving device and the second moving device may be the same moving device, and the imaging unit and the operation unit may be provided in the moving device so as to be spaced apart from each other by a predetermined pitch along the first direction.

<4> In the invention described above, the operation unit may operate the adjustment unit in accordance with movement along the first direction by the second moving device.

<5> In the invention described above, the adjustment unit may include: an input part operated by the operation unit; and an actuating part which performs planar movement and rotation of the holding part relative to the base part using a driving force input through the input part.

<6> In the invention described above, the operation unit may include: a plurality of first cams; and a plurality of driving parts which move the first cams independently along a direction substantially perpendicular to the first direction, and the input part may include a plurality of cam followers which follow the first cams.

<7> In the invention described above, each of the first cams may include: a first cam surface inclined with respect to the first direction; and a flat second cam surface extending in a direction opposite to the first direction from an end of the first cam surface.

<8> In the invention described above, the actuating part may include: a pressing piece connected to the cam follower; and a pressure receiving part which is fixed to the holding part and is pressed by the pressing piece.

<9> In the invention described above, the pressing piece may include a second cam connected to the cam follower through a shaft.

<10> In the invention described above, the actuating part may include a biasing device which biases the holding part in a direction in which the pressure receiving part is in contact with the pressing piece.

<11> In the invention described above, each of the contact arms may include a restraint unit which restrains the relative movement of the holding part with respect to the base part.

<12> In the invention described above, the imaging unit may include: a single imaging device; and a switching device which switches a direction of an optical axis of the imaging device to a direction toward the electronic component or the holding part.

<13> In the invention described above, the electronic component may include: a first terminal provided on one main surface; and a second terminal provided on the other main surface, the holding part may include a relay socket in contact with the second terminal, and the imaging unit may image the electronic component placed at a predetermined position, the holding part before holding the electronic component, and the electronic component held by the holding part.

<14> An electronic component handling apparatus according to the invention is an electronic component handling apparatus comprising: a contact arm which includes a holding part holding an electronic component and includes an adjustment unit moving the holding part relative to a base part of the contact arm; an imaging unit which images the electronic component and the holding part; and an operation unit which operates the adjustment unit, wherein the imaging unit includes: a single imaging device; and a switching device which switches a direction of an optical axis of the imaging device to a direction toward the electronic component or the holding part, and the adjustment unit adjusts a relative position of the holding part with respect to the base part according to an operation of the operation unit.

<15> An electronic component testing apparatus according to the invention is an electric component testing apparatus which tests an electronic component, comprising: the electronic component handling apparatus described above; a test head having a socket electrically connected to the electronic component; and a tester electrically connected to the test head, wherein the contact arm presses the electronic component against the socket.

<16> An electronic component testing method according to the invention is an electronic component testing method comprising: (a) holding electronic components using holding parts of a plurality of contact arms; (b) sequentially acquiring first image information by sequentially imaging a plurality of the electronic components held by the holding parts; (c) sequentially positioning the electronic components held by the holding parts with respect to sockets on the basis of the first image information; and (d) pressing the plurality of electronic components against the sockets using the plurality of contact arms.

<17> In the invention described above, the (c) may be started before the (b) is ended.

<18> In the invention described above, the testing method may further comprises: (e) acquiring second image information by imaging the sockets before the (c), and the (c) may include positioning the electronic components held by the holding parts with respect to the sockets on the basis of the first image information and the second image information.

<19> In the invention described above, the testing method may further comprises: (f) sequentially acquiring third image information by sequentially imaging the plurality of electronic components placed at predetermined positions; and (g) sequentially positioning the holding parts with respect to the electronic components on the basis of the third image information, and the (f) and (g) may be performed before the (a).

<20> In the invention described above, the (g) may be started before the (f) is ended.

<21> In the invention described above, the testing method may further comprises: (h) acquiring fourth image information by imaging the holding parts before the (g), and the (g) may include positioning the holding parts with respect to the electronic components on the basis of the third image information and the fourth image information.

In the present invention, it is possible to continuously image a plurality of holding parts or a plurality of electronic components and continuously perform the position adjustment of a plurality of holding parts. For this reason, when the number of contact arms is increased, it is possible to reduce the size of the electronic component handling apparatus and to improve the throughput by shortening the time required for alignment work.

Further, in the present invention, since the contact arm includes the adjustment unit and the electronic component handling apparatus includes the operation unit, the adjustment unit can be operated by the operation unit from the outside of the contact arm. Accordingly, it is possible to continuously perform the position adjustment of a plurality of holding parts. In addition, since the imaging unit includes the switching device, the holding part and the electronic component can be imaged by single imaging unit. As a result, it is possible to reduce the size of the electronic component handling apparatus.

BRIEF DESCRIPTION OF THE DRAWINGS

FIG. 10A is a cross-sectional view illustrating a modification of an adjustment unit, and FIG. 10B is a cross-sectional view taken along the line XB-XB of FIG. 10A;

DETAILED DESCRIPTION OF THE PREFERRED EMBODIMENTS

Hereinafter, an embodiment of the present invention will be described with reference to the accompanying drawings.

Figure 1:
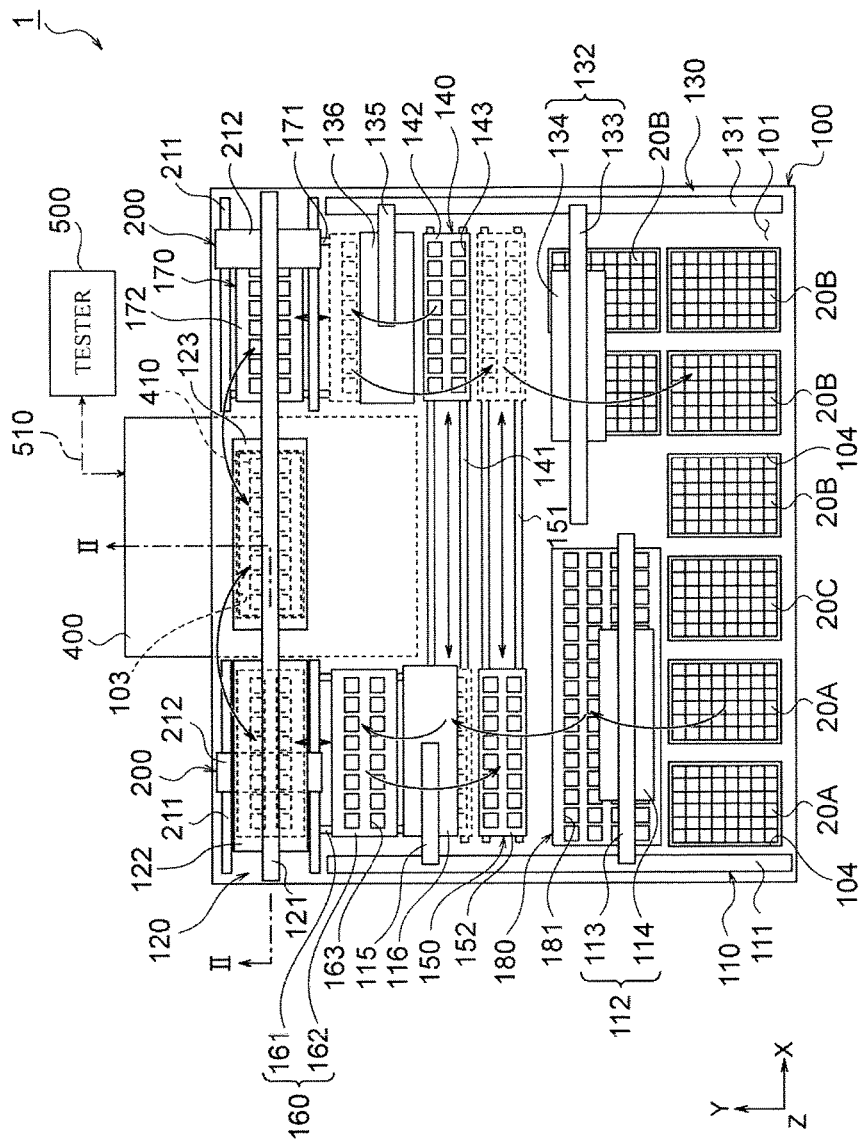
FIG. 1 is a plan view illustrating an electronic component testing apparatus in an embodiment of the present invention.

First, an overview of the entire configuration of an electronic component testing apparatus 1 in the present embodiment will be described with reference to FIG. 1. FIG. 1 is a plan view illustrating the electronic component testing apparatus 1 in the present embodiment.

As illustrated in FIG. 1, the electronic component testing apparatus 1 in the present embodiment includes a handler 100, a test head 400, and a tester 500, and is an apparatus that performs positioning of a DUT 10 (refer to FIG. 8 and the like) or the like using an image processing technology and then tests the DUT 10.

The test head 400 is inserted into a space 102 (refer to FIG. 2) formed below a base plate 101 of the handler 100, and a socket 410 of the test head 400 faces the inside of the handler 100 through an opening 103 (refer to FIG. 2) formed in the base plate 101. The test head 400 is electrically connected to the tester 500 through a cable 510. 16 sockets (2 rows by 8 columns) 410 are provided on the test head 400 so that 16 DUTs 10 can be simultaneously tested.

Note that the number of sockets 410 on the test head 400 is not particularly limited. For example, 4, 8, 32, or 64 sockets may be provided on the test head. The handler 100 in the present embodiment is equivalent to an example of the electronic component handling apparatus in the present invention.

In the electronic component testing apparatus 1, the handler 100 transports the DUT 10 before the test from a customer tray 20A to the test head 400, and presses the DUT 10 against the socket 410 of the test head 400 using a contact arm 300. Then, after testing the DUT 10 by the test head 400 and the tester 500, the handler 100 places the tested DUT 10 on a customer tray 20B while sorting the tested DUT 10 according to the test result.

Figure 8:
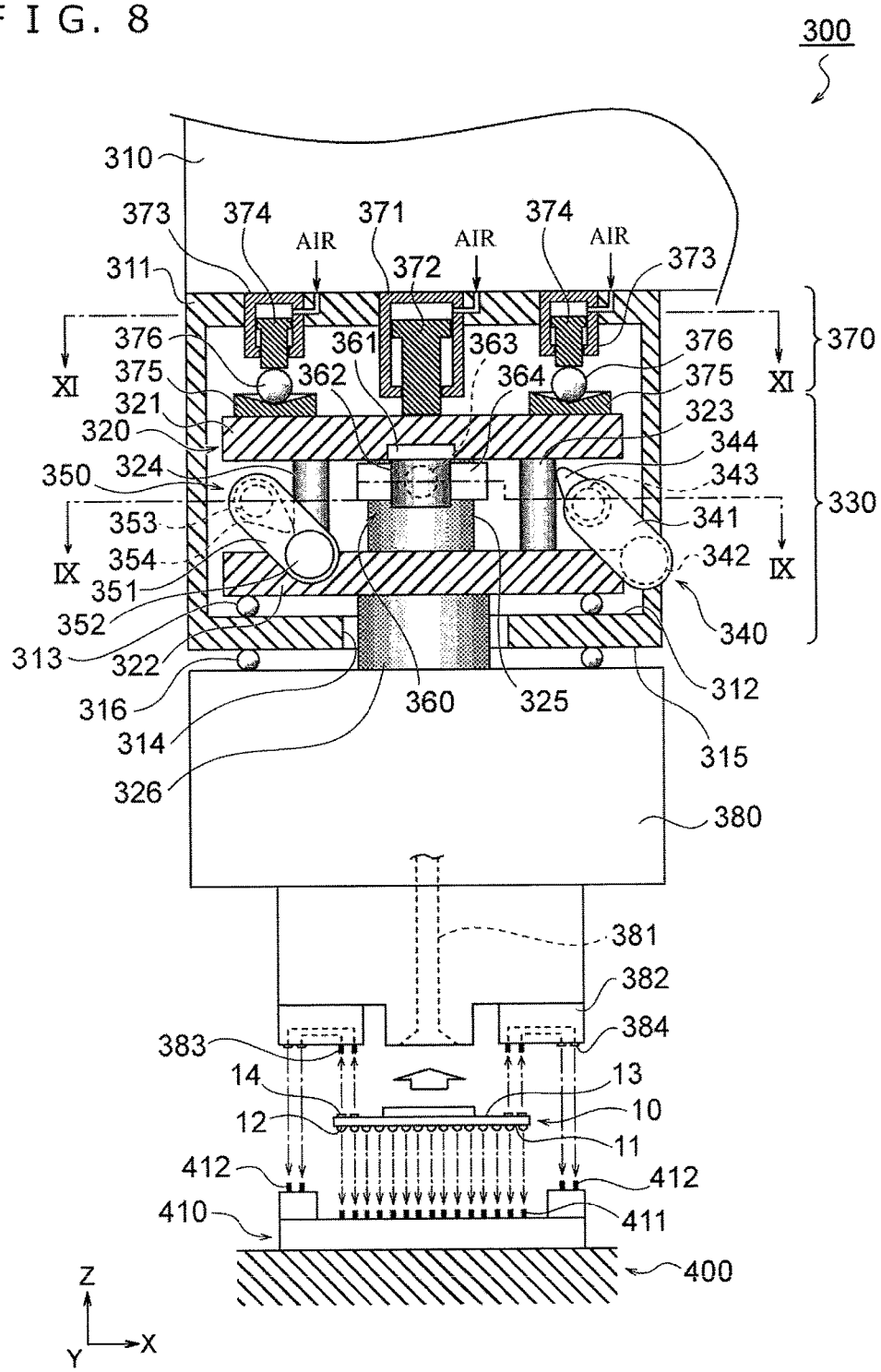
FIG. 8 is a partial cross-sectional view illustrating the internal structure of the contact arm in the embodiment of the present invention.

The DUT 10 in the present embodiment has a first terminal 12 provided on a bottom surface 11 and a second terminal 14 provided on a top surface 13 (refer to FIG. 8). Therefore, as will be described later, a relay socket 382 (refer to FIG. 8) provided in a holding part 380 of the contact arm 300 is positioned relative to the DUT 10 or the DUT 10 held by the holding part 380 is positioned relative to the socket 410 of the test head 400 using the image processing technology.

Note that the bottom surface 11 of the DUT 10 in the present embodiment is equivalent to an example of one surface of an electronic component in the present invention, and the top surface 13 of the DUT 10 in the present embodiment is equivalent to an example of the other surface of the electronic component in the present invention.

Hereinafter, the configuration of the handler 100 in the present embodiment will be described in detail with reference to FIG. 1.

As illustrated in FIG. 1, the handler 100 in the present embodiment includes three transport devices 110 to 130, two X-direction buffers 140 and 150, two Y-direction buffers 160 and 170, a heat plate 180, and two alignment devices 200.

The first transport device 110 includes a Y-direction rail 111, a feed arm 112, and a first transfer arm 115. The Y-direction rail 111 is constructed above the base plate 101 of the handler 100, and extends along the Y direction.

The feed arm 112 includes an X-direction rail 113 and a movable head 114. The X-direction rail 113 can move on the Y-direction rail 111 along the Y direction. The movable head 114 can move on the X-direction rail 113 along the X direction. Although not illustrated in particular, the movable head 114 includes 16 suction heads that can adsorb and hold the DUT 10, and these suction heads can move up and down independently of each other.

The customer trays 20A and 20B are disposed in a window portion 104 of the base plate 101, and the feed arm 112 takes up the DUT 10 before the test from the customer tray 20A and moves it to the heat plate 180. Note that, in FIG. 1, the DUT 10 before the test is placed on the two customer trays 20A on the left side. On the other hand, the tested DUT 10 is placed on the five customer trays 20B on the right side in FIG. 1, and each customer tray 20B is matched with the test result of the DUT 10. Incidentally, a customer tray 20C located next to the right side in FIG. 1 of the two customer trays 20A is an empty customer tray on which no DUT 10 is placed.

A plurality of recesses 181 are formed on the surface of the heat plate 180. When the DUT 10 is placed in the recess 181 by the feed arm 112, the DUT 10 is heated by a heater (not illustrated) embedded in the heat plate 180. When the DUT 10 is sufficiently heated, the feed arm 112 moves the DUT 10 from the heat plate 180 to the first X-direction buffer 140.

The first X-direction buffer 140 includes an X-direction rail 141 and a moving plate 142. The X-direction rail 141 is provided on the base plate 101, and extends between the operating range of the first transfer arm 115 and the operating range of a second transfer arm 135, which will be described later, along the X direction. The moving plate 142 can move on the X-direction rail 141 along the X direction. 16 recesses 143 capable of containing the DUT 10 therein are formed on the surface of the moving plate 142, and the DUT 10 is placed in the recess 143 by the feed arm 112.

Here, as will be described later, the second transport device 120 includes two movable heads 122 and 123. Accordingly, while one movable head 122 (or 123) is doing alignment work, the other movable head 123 (or 122) can press the DUT 10 against the socket 410. Thus, since the time required for alignment work is absorbed by each other, it is possible to improve the throughput.

For this reason, in the present embodiment, when feeding the DUT 10 to the first movable head 122 on the left side in FIG. 1, the first X-direction buffer 140 remains positioned within the operating range of the first transfer arm 115 even after the placement of the DUT 10 by the first feed arm 112. In contrast, when feeding the DUT 10 to the second movable head 123 on the right side in FIG. 1, the first X-direction buffer 140 moves into the operating range of the second transfer arm 135 after the placement of the DUT 10 by the first feed arm 112.

When feeding the DUT 10 to the first movable head 122, the first transfer arm 115 moves the DUT 10 from the first X-direction buffer 140 to the first Y-direction buffer 160.

The first transfer arm 115 includes a movable head 116 that can move on the Y-direction rail 111 along the Y direction. Although not illustrated in particular, the movable head 116 includes 16 suction heads that can adsorb and hold the DUT 10, and these suction heads can move up and down independently of each other.

On the other hand, the first Y-direction buffer 160 includes a Y-direction rail 161 and a moving plate 162. The Y-direction rail 161 is provided on the base plate 101, and extends between the operating range of the first transfer arm 115 and the operating range of the first movable head 122 along the Y direction. The moving plate 162 can move on the Y-direction rail 161 along the Y direction. 16 recesses 163 capable of containing the DUT 10 therein are formed on the surface of the moving plate 162, and the DUT 10 is placed in the recess 163 by the first transfer arm 115.

When the DUT 10 is placed by the first transfer arm 115, the first Y-direction buffer 160 moves the moving plate 162 into the operating range of the first movable head 122 of the second transport device 120.

In the present embodiment, the alignment device 200 is provided in an overlapping portion between the operating range of the first Y-direction buffer 160 and the operating range of the first movable head 122. The first movable head 122 takes up the DUT 10 from the first Y-direction buffer 160 while positioning the relay socket 382 or the DUT 10 using the alignment device 200. Note that the structure of the alignment device 200 will be described in detail later.

The second transport device 120 includes an X-direction rail 121 and the first and second movable heads 122 and 123. The X-direction rail 121 is constructed above the base plate 101 of the handler 100, and extends along the X direction.

The first and second movable heads 122 and 123 can move on the X-direction rail 121 along the X direction independently of each other.

Each of the first and second movable heads 122 and 123 includes 16 contact arms 300 arrayed in 2 rows by 8 columns. Accordingly, each of the first and second movable heads 122 and 123 can hold 16 DUTs 10 simultaneously (refer to FIG. 2). In addition, a first camera 125 for imaging the socket 410 of the test head 400 is provided in each of the first and second movable heads 122 and 123 (refer to FIG. 2). Note that the configuration of the contact arm 300 will be described later.

Note that the number of contact arms 300 provided in each of the first and second movable heads 122 and 123 is not particularly limited to the number described above, but is set according to the number of sockets 410 on the test head 400.

The first movable head 122 moves the DUT 10 above the socket 410 of the test head 400 and then lowers each contact arm 300 to make the DUT 10 electrically connected to the socket 410. In this state, the test head 400 and the tester 500 test the DUT 10 by inputting and outputting a test signal with respect to the DUT 10.

After the test of the DUT 10 is completed, the first movable head 122 returns the DUT 10 to the first Y-direction buffer 160. Then, the tested DUT 10 is moved into the operating range of the first transfer arm 115 by the first Y-direction buffer 160, and is transshipped from the first Y-direction buffer 160 to the second X-direction buffer 150 by the first transfer arm 115. Then, the tested DUT 10 is transported into the operating range of a sorting arm 132 of the third transport device 130 by the second X-direction buffer 150.

Note that, similarly to the first X-direction buffer 140 described above, the second X-direction buffer 150 includes an X-direction rail 151 and a moving plate 152 so that it is possible to move the DUT 10 between the operating range of the first transfer arm 115 and the operating range of the sorting arm 132.

On the other hand, when feeding the DUT 10 to the second movable head 123 on the right side in FIG. 1, the first X-direction buffer 140 moves into the operating range of the second transfer arm 135 of the third transport device 130, and the second transfer arm 135 transships the DUT 10 from the first X-direction buffer 140 to the second Y-direction buffer 170.

The third transport device 130 includes a Y-direction rail 131, the sorting arm 132, and the second transfer arm 135. The Y-direction rail 131 is constructed above the base plate 101 of the handler 100, and extends along the Y direction.

The second transfer arm 135 includes a movable head 136 that can move on the Y-direction rail 131 along the Y direction. Although not illustrated in particular, the movable head 136 includes 16 suction heads that can adsorb and hold the DUT 10, and these suction heads can move up and down independently of each other.

When the DUT 10 is placed in the second Y-direction buffer 170 by the second transfer arm 135, the second Y-direction buffer 170 moves into the operating range of the second movable head 123 of the second transport device 120.

Similarly to the first Y-direction buffer 160 described above, the second Y-direction buffer 170 includes a Y-direction rail 171 and a moving plate 172 so that it is possible to move the DUT 10 between the operating range of second transfer arm 135 and the operating range of the second movable head 123.

The alignment device 200 is also provided in an overlapping portion between the operating range of the second Y-direction buffer 170 and the operating range of the second movable head 123. The second movable head 123 takes up the DUT 10 from the second Y-direction buffer 170 while positioning the relay socket 382 or the DUT 10 using the alignment device 200.

Then, the second movable head 123 moves the DUT 10 above the socket 410 and then lowers the contact arm 300 to make the DUT 10 electrically connected to the socket 410. In this state, the test head 400 and the tester 500 test the DUT 10 by inputting and outputting a test signal with respect to the DUT 10.

After the test of the DUT 10 is completed, the second movable head 123 returns the DUT 10 to the second Y-direction buffer 170. Then, the tested DUT 10 is moved into the operating range of the second transfer arm 135 by the second Y-direction buffer 170, and is transshipped from the second Y-direction buffer 170 to the second X-direction buffer 150 by the second transfer arm 135.

The sorting arm 132 of the third transport device 130 includes an X-direction rail 133 and a movable head 134. The X-direction rail 133 can move on the Y-direction rail 131 along the Y direction. In addition, the movable head 134 can move on the X-direction rail 133 along the X direction. Although not illustrated in particular, the movable head 134 includes 16 suction heads that can adsorb and hold the DUT 10, and these suction heads can move up and down independently of each other.

The sorting arm 132 transships the tested DUT 10 from the second X-direction buffer 150 to the customer tray 20B. At this time, the sorting arm 132 sorts the DUT 10 according to the test result by moving the DUT 10 to the customer tray 20B corresponding to the test result.

Next, the configuration of the alignment device 200 in the present embodiment will be described with reference to FIGS. 2 to 6.

Note that, although the configuration of the alignment device 200 provided within the operating range of the first movable head 122 will be described below, the alignment device 200 provided within the operating range of the second movable head 123 also has the same configuration.

Figure 2:
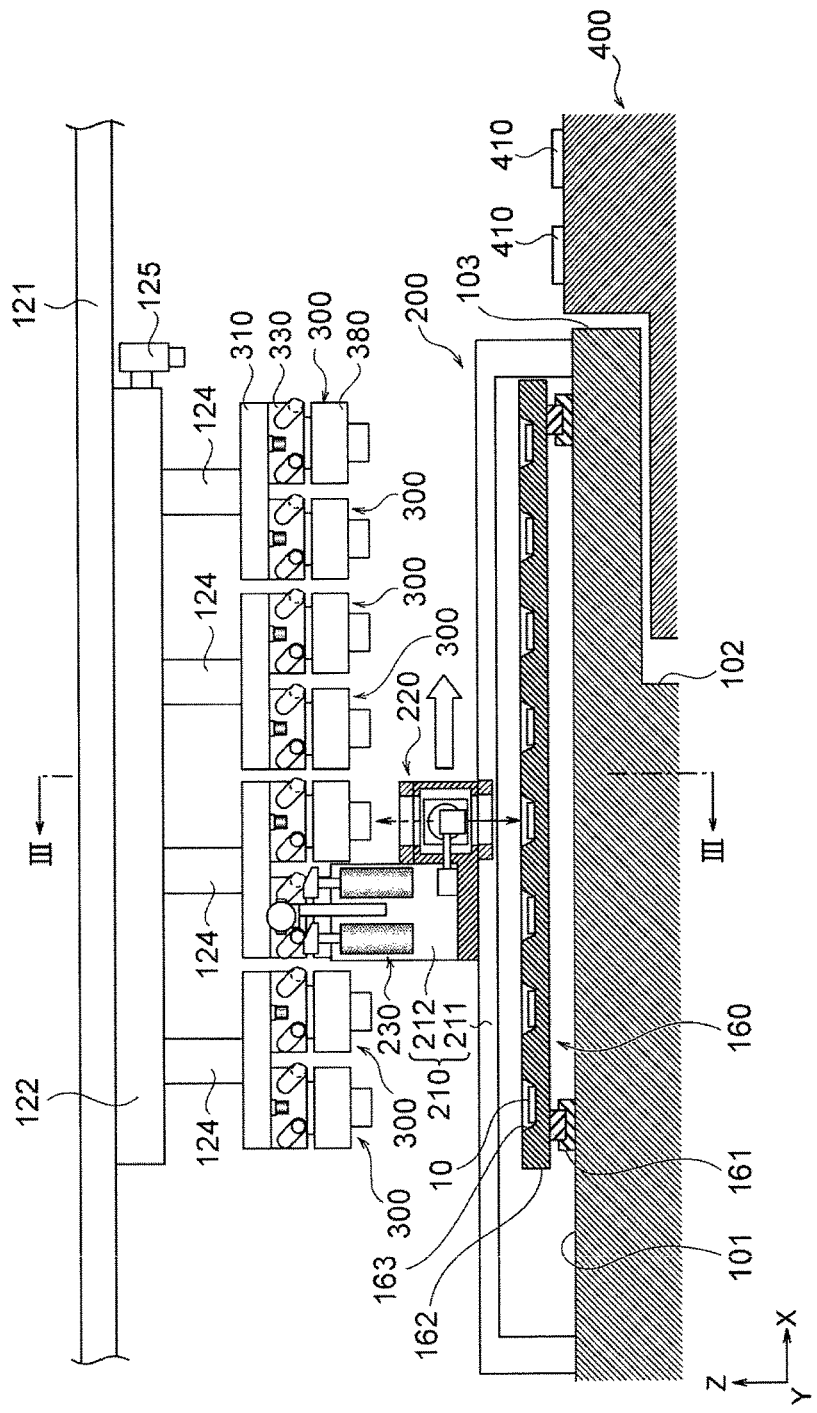
FIG. 2 is a cross-sectional view taken along the line II-II of FIG. 1.
Figure 3:
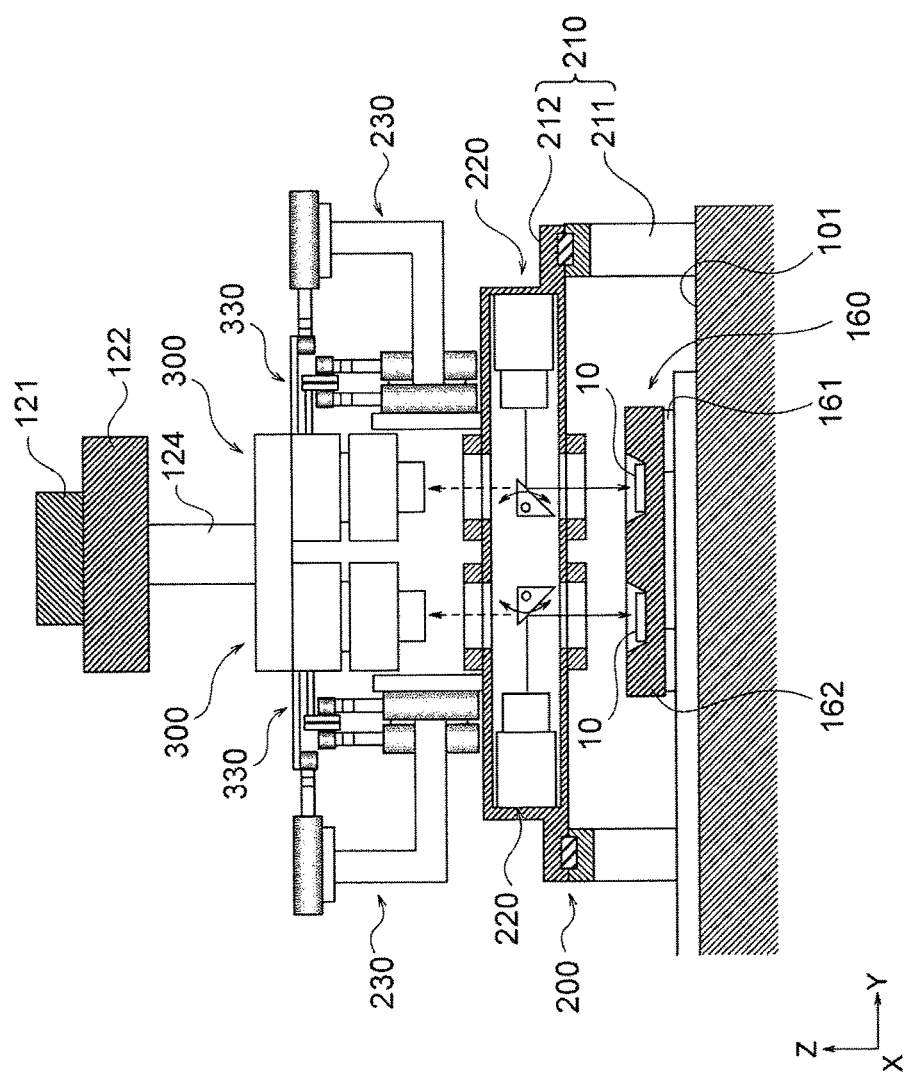
FIG. 3 is a cross-sectional view taken along the line III-III of FIG. 2.
Figure 4:
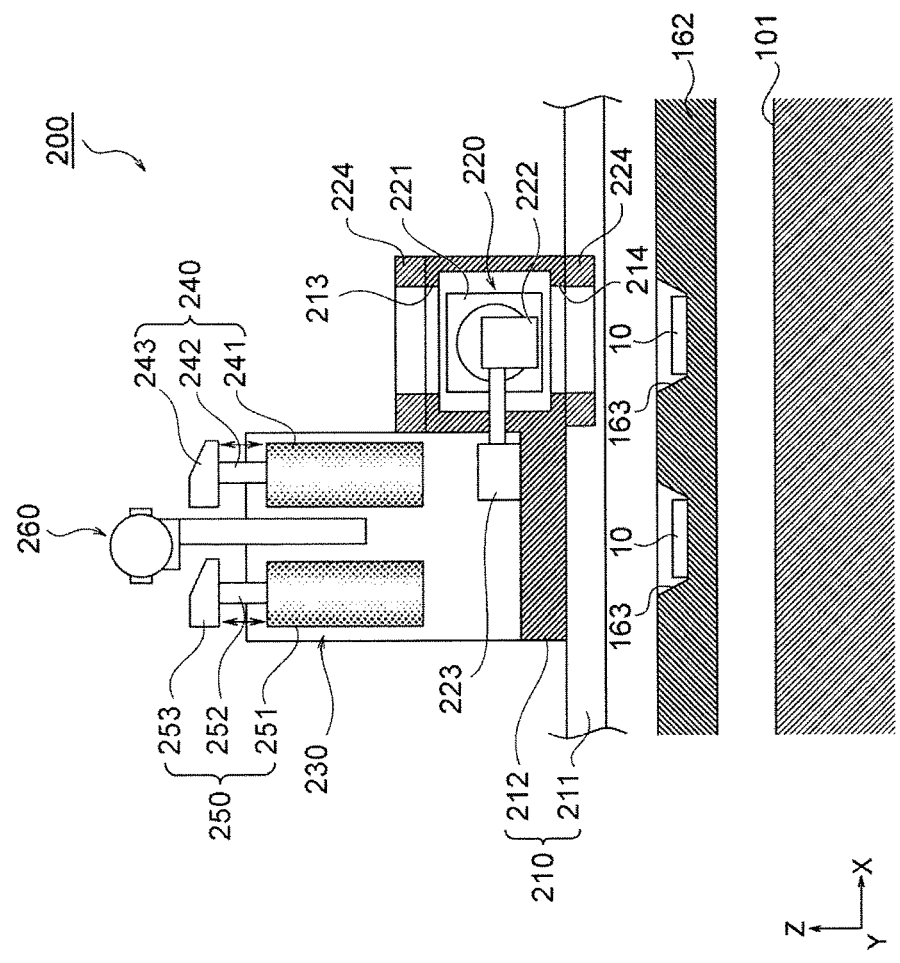
FIG. 4 is an enlarged view of an alignment device illustrated in FIG. 2.
Figure 5:
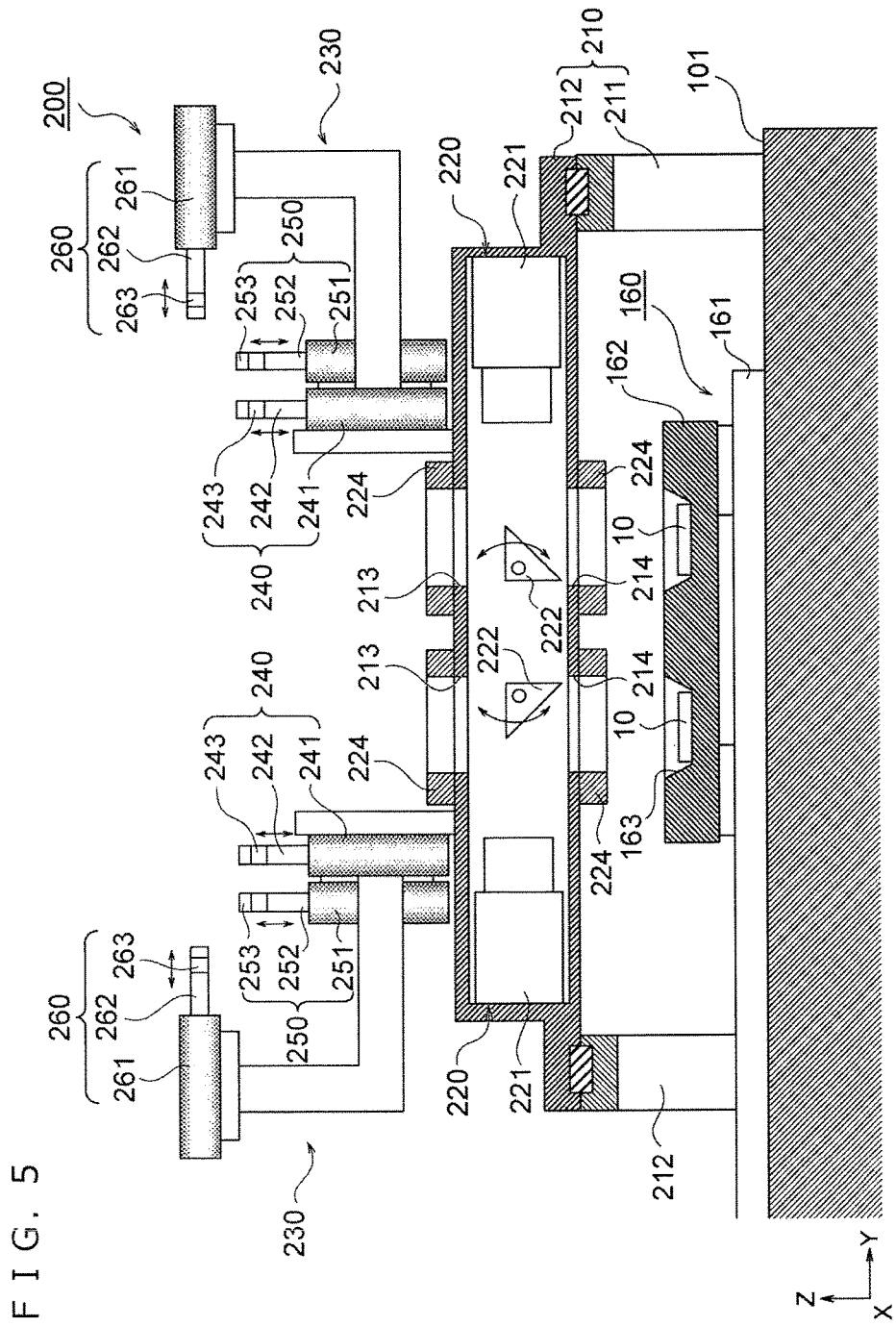
FIG. 5 is an enlarged view of an alignment device illustrated in FIG. 3.
Figure 6:
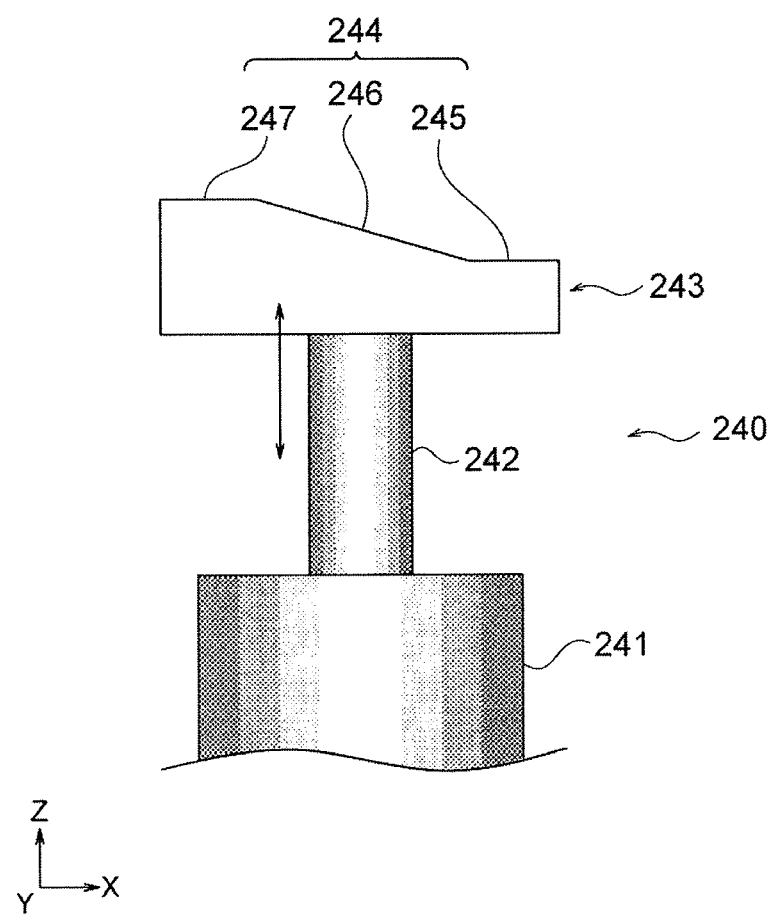
FIG. 6 is an enlarged view of an operation unit in the embodiment of the present invention.

FIG. 2 is a cross-sectional view taken along the line II-II of FIG. 1. FIG. 3 is a cross-sectional view taken along the line III-III of FIG. 2. FIGS. 4 and 5 are enlarged views of alignment devices illustrated in FIGS. 2 and 3. FIG. 6 is an enlarged view of an operation unit in the embodiment of the invention.

The alignment device 200 in the present embodiment is a device used for the positioning of the relay socket 382 or the DUT 10. As illustrated in FIGS. 2 to 5, the alignment device 200 includes a moving unit 210, an imaging unit 220, and an operation unit 230. The moving unit 210 in the present embodiment is equivalent to an example of the moving device in the present invention.

The moving unit 210 includes an X-direction rail 211 and a slide portion 212. A pair of X-direction rails 211 extends along the X direction so as to be positioned on the left and right sides of the moving plate 162 of the first Y-direction buffer 160 located within the operating range of the first movable head 122.

The slide portion 212 is configured to be able to slide on the X-direction rail 211 along the X direction by a motor and a belt mechanism (not illustrated in particular). The imaging unit 220 and the operation unit 230 are provided in the slide portion 212 so that the imaging unit 220 and the operation unit 230 can also move in the X direction together with the slide portion 212.

In the present embodiment, the imaging unit 220 and the operation unit 230 are provided in the slide portion 212 so as to be spaced apart from each other by substantially the same pitch as the pitch between the contact arms 300 in the X direction. For this reason, imaging of the DUT 10 or the relay socket 382 by the imaging unit 220 and an operation of an adjustment unit 330 by the operation unit 230 can be simultaneously performed.

Note that the pitch between the imaging unit 220 and the operation unit 230 is not particularly limited to the above-described pitch. Further, the imaging unit 220 and the operation unit 230 may be provided in separate moving units so that the imaging unit 220 and the operation unit 230 can move independently of each other.

The imaging unit 220 includes a second camera 221, a mirror 222, an air cylinder 223, and a light 224. The second camera 221 is, for example, an imaging means having a CCD device, a lens, and the like, and is laterally placed in the slide portion 212. The mirror 222 is disposed on the optical axis of the second camera 221.

The mirror 222 is fixed to the driving shaft of the air cylinder 223. By driving of the air cylinder 223, it is possible to rotate the mirror 222 by 90° through the driving shaft. Accordingly, it is possible to switch the optical axis of the second camera 221 upward or downward. The mirror 222 and the air cylinder 223 in the present embodiment are equivalent to an example of the switching device in the present invention.

In addition, openings 213 and 214 through which the optical axis of the second camera 221 reflected by the mirror 222 passes are formed in the slide portion 212. Therefore, according to the switching of the direction of the optical axis by the mirror 222, the second camera 221 can image the DUT 10 placed on the moving plate 162 of the first Y-direction buffer 160 or image the holding unit 380 of the contact arm 300.

Further, the light 224 in which LEDs are annularly arrayed is provided in each of the openings 213 and 214 of the slide portion 212. Accordingly, it is possible to illuminate the DUT 10 on the moving plate 162 or the holding part 380 at the time of imaging of the second camera 221.

The operation unit 230 is a unit that operates the adjustment unit 330 of the contact arm 300 to be described later, and includes three operation portions 240 to 260.

The first operation portion 240 is a mechanism for operating a first adjustment portion 340 (which will be described later) of the adjustment unit 330, and includes a first motor 241, a first shaft 242, and a first translating (linear advancement) cam 243.

The first motor 241 is fixed to the slide portion 212 of the moving unit 210, so that it is possible to expand and contract the first shaft 242 along the Z-axis direction. The first translating cam 243 is attached to the distal end of the first shaft 242.

As illustrated in FIG. 6, the first translating cam 243 has a cam surface 244 on which a first cam follower 342 (which will be described later) of the first adjustment portion 340 rolls, and the cam surface 244 includes a first flat surface 245, an inclined surface 246, and a second flat surface 247.

The first translating cam 243 in the present embodiment is equivalent to an example of a first cam in the present invention, the inclined surface 246 in the present embodiment is equivalent to an example of a first cam surface in the present invention, and the second flat surface 247 in the present embodiment is equivalent to an example of the second cam surface in the present invention.

The first and second flat surfaces 245 and 247 extend substantially in parallel to the movement direction (X direction) of the slide portion 212. On the other hand, the inclined surface 246 is provided between the two flat surfaces 245 and 247, and is inclined with respect to the movement direction (X direction) of the slide portion 212.

The second operation portion 250 is a mechanism for operating a second adjustment portion 350 (which will be described later) of the adjustment unit 330. Similarly to the first operation portion 240, the second operation portion 250 also includes a second motor 251, a second shaft 252, and a second translating cam 253. The second translating cam 253 in the present embodiment is equivalent to an example of the first cam in the present invention.

The second motor 251 is fixed to the slide portion 212 of the moving unit 210, so that it is possible to expand and contract the second shaft 252 along the Z-axis direction. The second translating cam 253 having the same shape as the first translating cam 243 is attached to the distal end of the second shaft 252. A second cam follower 352 (which will be described later) of the second adjustment portion 350 rolls on the cam surface of the second translating cam 253.

The third operation portion 260 is a mechanism for operating a third adjustment portion 360 (which will be described later) of the adjustment unit 330. Similarly to the first and second operation portions 240 and 250, the third operation portion 260 also includes a third motor 261, a third shaft 262, and a third translating cam 263. However, the third operation portion 260 is different from the first and second operation portions 240 and 250 in that the third motor 261 is fixed to the slide portion 212 of the moving unit 210 so as to expand and contract the third shaft 262 along the Y direction. The third translating cam 263 in the present embodiment is equivalent to an example of the first cam in the present invention.

The third translating cam 263 having the same shape as the first and second translating cams 243 and 253 is attached to the distal end of the third shaft 262. A third cam follower 362 (which will be described later) of the third adjustment portion 360 rolls on the cam surface of the third translating cam 263.

In the present embodiment, since 16 contact arms 300 are arrayed in 2 rows by 8 columns in the first movable head 122 of the second transport device 120, two sets of imaging units 220 are provided in the slide portion 212 and two sets of operation units 230 are provided in the slide portion 212.

Next, the configuration of the contact arm 300 in the present embodiment will be described with reference to FIGS. 7 to 10.

Note that, although the configuration of the contact arm 300 of the first movable head 122 will be described below, the contact arm 300 of the second movable head 123 also has the same configuration.

Figure 7:
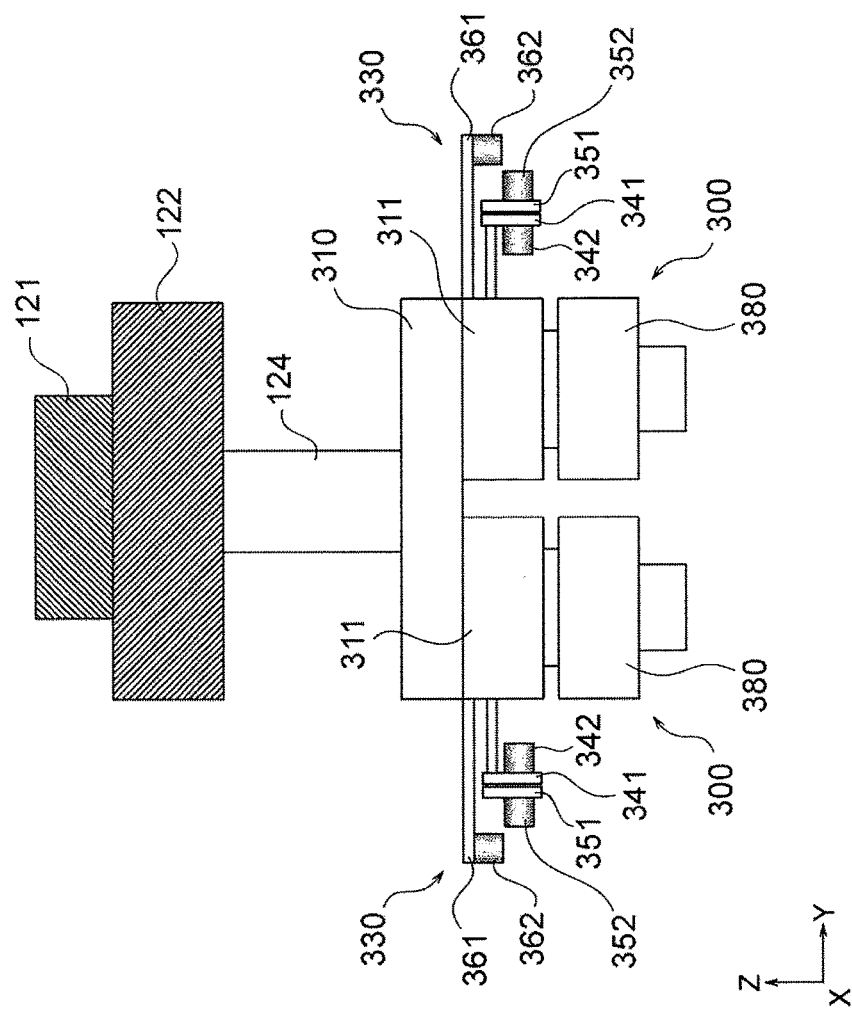
FIG. 7 is an enlarged view of a contact arm illustrated in FIG. 3.
Figure 9:
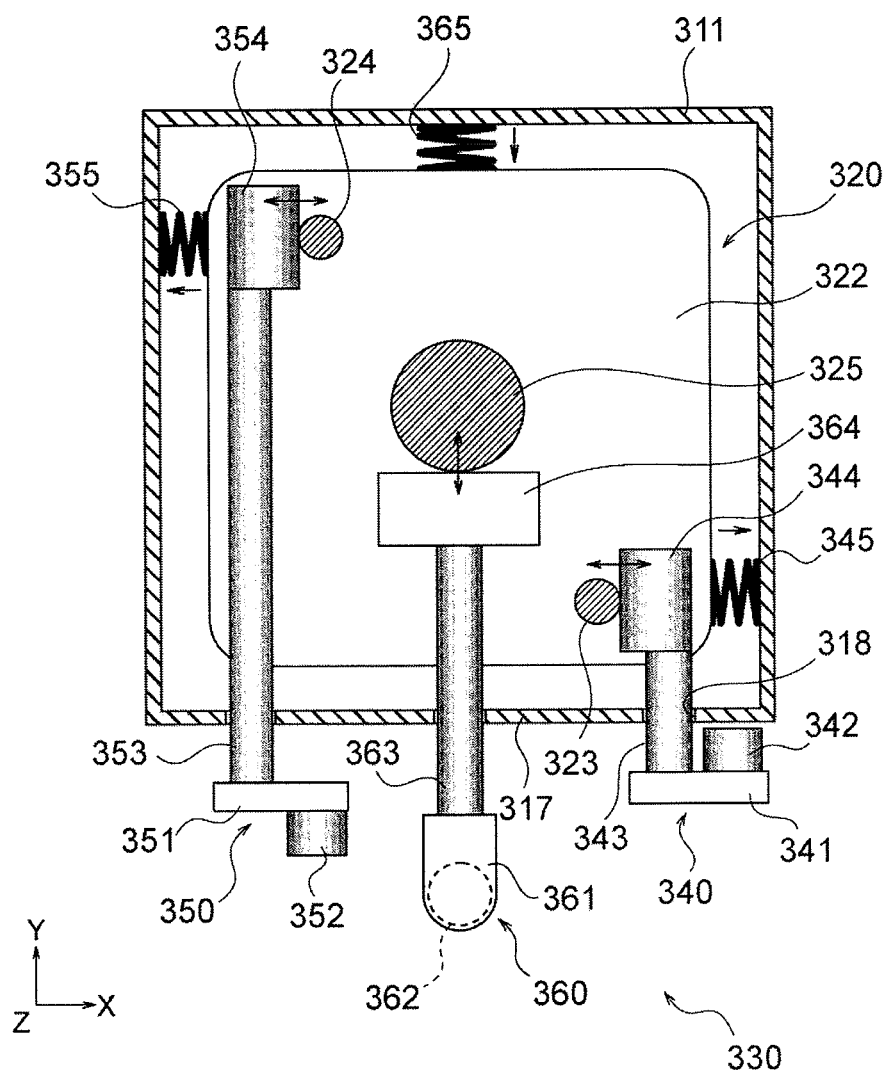
FIG. 9 is a cross-sectional view taken along the line IX-IX of FIG. 8.
Figure 11:
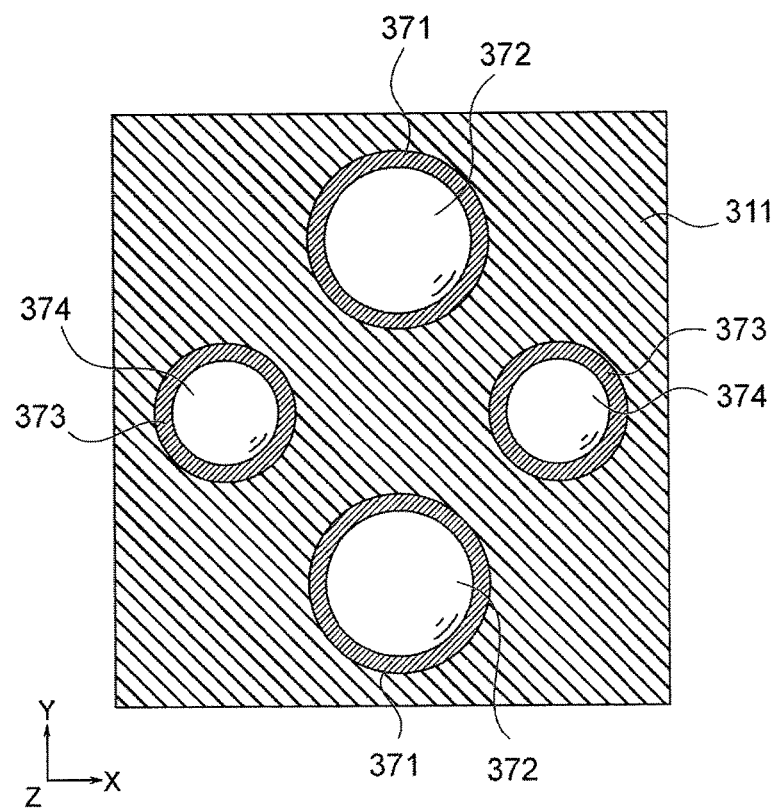
FIG. 11 is a cross-sectional view taken along the line XI-XI of FIG. 8.

FIG. 7 is an enlarged view of the contact arm illustrated in FIG. 3. FIG. 8 is a partial cross-sectional view illustrating the internal structure of the contact arm. FIG. 9 is a cross-sectional view taken along the line IX-IX of FIG. 8. FIGS. 10A and 10B are diagrams illustrating a modification of a second adjustment portion. FIG. 11 is a cross-sectional view taken along the line XI-XI of FIG. 8.

As illustrated in FIGS. 7 and 8, the contact arm 300 in the present embodiment includes a base part 310, a floating unit 320, the adjustment unit 330, a lock and free unit 370, and the holding part 380. The lock and free unit 370 in the present embodiment is equivalent to an example of the restraint unit in the present invention.

The base part 310 of the contact arm 300 is connected to the first movable head 122 through a Z-direction actuator 124. Note that, as illustrated in FIG. 7, two contact arms 300 share one base part 310 in this example. However, for example, each contact arm 300 may have a separate base part 310 without being particularly limited to the above example.

A housing 311 is fixed to the bottom of the base part 310. As illustrated in FIG. 8, the floating unit 320, the adjustment unit 330, and the lock and free unit 370 are housed in the housing 311.

The floating unit 320 includes two plates 321 and 322, three struts 323 to 325, and a connection shaft 326. The first to third struts 323 to 325 are provided between the first and second plates 321 and 322, and the two plates 321 and 322 are connected to each other by the three struts 323 to 325.

As illustrated in FIG. 9, the first strut 323 is disposed on the lower right side in the drawing of the second plate 322, while the second strut 324 is disposed on the upper left side in the drawing of the second plate 322. The first and second struts 323 and 324 are disposed on the same diagonal line of the second plate 322. On the other hand, the third strut 325 is disposed approximately at the center of the second plate 322.

Note that, as will be described later, a first plate cam 344 of the adjustment unit 330 is in contact with the first strut 323, a second plate cam 354 of the adjustment unit 330 is in contact with the second strut 324, and a pressing block 364 of the adjustment unit 330 is in contact with the third strut 325. The first to third struts 323 to 325 in the present embodiment are equivalent to an example of the pressure receiving part in the invention.

As illustrated in FIG. 8, a ball bearing 313 is interposed between the second plate 322 of the floating unit 320 and an inner bottom surface 312 of the housing 311. Accordingly, since the floating unit 320 is held by the housing 311 in a floating state on the plane substantially parallel to the inner bottom surface 312 (hereinafter, simply referred to as "XY plane"), the floating unit 320 can perform horizontal movement and rotation on the XY plane.

In addition, the connection shaft 326 is fixed to the bottom surface of the second plate 322 of the floating unit 320. The connection shaft 326 extends downward through an opening 314 formed on the inner bottom surface 312 of the housing 311, and the lower end of the connection shaft 326 is connected to the holding part 380. Accordingly, the holding part 380 can perform planar movement and rotation relative to the base part 310 to which the housing 311 is fixed. Note that a ball bearing 316 is interposed between an outer bottom surface 315 of the housing 311 and a top surface of the holding part 380.

As illustrated in FIGS. 8 and 9, the adjustment unit 330 includes three adjustment portions 340 to 360, and is a mechanism for making the floating unit 320 perform horizontal movement and rotation on the XY plane according to the operation of the operation unit 230.

The first adjustment portion 340 includes a first input lever 341, the first cam follower 342, a first shaft 343, the first plate cam 344, and a first spring 345.

Note that the first input lever 341 and the first cam follower 342 in the present embodiment are equivalent to an example of an input part in the present invention, the first plate cam 344 in the present embodiment is equivalent to an example of a second cam in the present invention, and the first spring 345 in the present embodiment is equivalent to an example of the biasing device in the present invention.

The first cam follower 342 protruding toward the housing 311 is attached to one end of the first input lever 341. The first cam follower 342 is rotatably held on the first input lever 341. The first cam follower 342 follows the cam surface 244 of the first translating cam 243 of the above-mentioned operation unit 230.

On the other hand, one end of the first shaft 343 is connected to the other end of the first input lever 341. The first shaft 343 enters the inside of the housing 311 through a through hole 318 formed on a side surface 317 of the housing 311, and is rotatably held by the housing 311 through a bearing (not illustrated in particular).

The first plate cam 344 is fixed to the other end of the first shaft 343. The first plate cam 344 has an approximately egg-shaped outer peripheral surface, and is in contact with the first strut 323 of the floating unit 320.

As illustrated in FIG. 9, the first spring 345 is interposed between the housing 311 and the floating unit 320. The first spring 345 is a tension spring that biases the first strut 323 of the floating unit 320 toward the first plate cam 344. By the first spring 345, the first plate cam 344 and the first strut 323 are always in contact with each other, and the first input lever 341 is biased in the clockwise direction in FIG. 8 through the first shaft 343.

The first adjustment portion 340 operates as follows.

That is, when the first cam follower 342 rolls on the cam surface 244 of the first translating cam 243 to push up the first input lever 341, the first plate cam 344 rotates in the counterclockwise direction in FIG. 8 through the first shaft 343 to press the first strut 323 in the left direction (−X direction) in FIG. 8.

On the other hand, when the pressing force of the first plate cam 344 with respect to the first strut 323 is removed, the first strut 323 moves in the right direction (+X direction) in FIG. 8 due to the elastic force of the first spring 345, and the first input lever 341 rotates in the clockwise direction in FIG. 8 through the first shaft 343.

Similarly to the first adjustment portion 340, the second adjustment portion 350 also includes a second input lever 351, the second cam follower 352, a second shaft 353, the second plate cam 354, and a second spring 355.

The second input lever 351 and the second cam follower 352 in the present embodiment are equivalent to an example of the input part in the present invention, the second plate cam 354 in the present embodiment is equivalent to an example of the second cam in the present invention, and the second spring 355 in the present embodiment is equivalent to an example of the biasing device in the present invention.

The second cam follower 352 is attached to the second input lever 351 so as to protrude in a direction away from the housing 311, and follows the cam surface of the second translating cam 253 of the operation unit 230. The second plate cam 354 is in contact with the second strut 324 of the floating unit 320.

As illustrated in FIG. 9, the second spring 355 is a tension spring that biases the second strut 324 of the floating unit 320 toward the second plate cam 354, and is interposed between the housing 311 and the floating unit 320. By the second spring 355, the second plate cam 354 and the second strut 324 are always in contact with each other, and the second input lever 351 is biased in the clockwise direction in FIG. 8 through the second shaft 353.

The second adjustment portion 350 operates as follows.

That is, when the second cam follower 352 rolls on the cam surface of the second translating cam 253 to push up the second input lever 351, the second plate cam 354 rotates in the counterclockwise direction in FIG. 8 through the second shaft 353 to press the second strut 324 in the right direction (+X direction) in FIG. 8.

On the other hand, when the pressing force of the second plate cam 354 with respect to the second strut 324 is removed, the second strut 324 moves in the left direction (−X direction) in FIG. 8 due to the elastic force of the second spring 355, and the second input lever 351 rotates in the clockwise direction in FIG. 8 through the second shaft 353.

Note that, as illustrated in FIG. 10A, the second plate cam 354 may be fixed to the second shaft 353 such that the distal end of the second plate cam 354 faces upward. In this case, as illustrated in FIG. 10B, a torsion spring 356 is added to the second adjustment portion 350. The torsion spring 356 biases the second input lever 351 in the clockwise direction in FIG. 10A.

Similarly to the first and second adjustment portions 340 and 350, the third adjustment portion 360 also includes a third input lever 361, the third cam follower 362, a third shaft 363, and a third spring 365. However, the third adjustment portion 360 includes the pressing block 364 instead of the plate cams 344 and 354.

The third input lever 361 and the third cam follower 362 in the present embodiment are equivalent to an example of the input part in the present invention, the pressing block 364 in the present embodiment is equivalent to an example of the pressing piece in the present invention, and the third spring 365 in the present embodiment is equivalent to an example of the biasing device in the present invention.

The third cam follower 362 is attached to one end of the third input lever 361 so as to protrude downward, and follows the cam surface of the third translating cam 263 of the operation unit 230. The pressing block 364 fixed to the end of the third shaft 363 is in contact with the third strut 325 of the floating unit 320.

As illustrated in FIG. 9, the third spring 365 is a compression spring that biases the third strut 325 of the floating unit 320 toward the pressing block 364, and is interposed between the housing 311 and the floating unit 320. By the third spring 365, the pressing block 364 and the third strut 325 are always in contact with each other, and the third input lever 361 is biased in the downward direction (−Y direction) in FIG. 9 through the third shaft 363.

The third adjustment portion 360 operates as follows.

That is, when the third cam follower 362 rolls on the cam surface of the third translating cam 263 to press the third input lever 361 in the upward direction (+Y direction) in FIG. 9, the third strut 325 is also pressed in the upward direction (+Y direction) in FIG. 9 through the third shaft 363 and the third pressing block 364.

On the other hand, when the pressing force of the pressing block 364 with respect to the third strut 325 is removed, the third strut 325 moves in the downward direction (−Y direction) in FIG. 9 due to the elastic force of a third spring 365, and the third input lever 361 also moves in the downward direction (−Y direction) in FIG. 9 through the third shaft 363.

In the adjustment unit 330 described above, it is possible to move the floating unit 320 horizontally on the XY plane or rotate the floating unit 320 on the XY plane, for example, by operating the first and second input levers 341 and 351. Further, the floating unit 320 can be horizontally moved in the Y direction by pressing the third input lever 361.

As illustrated in FIGS. 8 and 11, the lock and free unit 370 of the contact arm 300 includes first and second air cylinders 371 and 373, a receiving portion 375, and a steel ball 376.

As illustrated in FIG. 11, two first air cylinders 371 are disposed along the Y direction, and two second air cylinders 273 are disposed along the X direction.

The first air cylinder 371 includes a piston 372 that can be in contact with the first plate 321 of the floating unit 320. The first air cylinder 371 can restrain the movement of the floating unit 320 by pressing the first plate 321 with the piston 372, and can release the restraint of the floating unit 320 by weakening the pressure of the piston 372.

In addition, the receiving portion 375 having a concave curved surface is provided on the first plate 321 of the floating unit 320. The steel ball 376 is placed on the receiving portion 375, and a piston 374 of the second air cylinder 373 is in contact with the steel ball 376 from above.

When the piston 374 of the second air cylinder 373 presses the steel ball 376, the floating unit 320 moves relative to the housing 311 so that a central portion of the curved surface of the receiving portion 375 faces the steel ball 376. Accordingly, the holding part 380 is centered with respect to the base part 310, and the relative position of the holding part 380 with respect to the base part 310 returns to the initial state (initialized).

As illustrated in FIG. 8, the holding part 380 of the contact arm 300 includes a suction pad 381 and the relay socket 382. The suction pad 381 is opened at the approximate center of the lower end of the holding part 380, and is connected to a vacuum pump (not illustrated) through a passage formed in the holding part 380. Accordingly, it is possible to adsorb and hold the DUT 10.

The relay socket 382 is mounted on the lower end of the holding part 380 so as to surround the suction pad 381. The relay socket 382 includes contact pins 383 and contact pads 384. The contact pins 383 are disposed so as to correspond to the second terminals 14 of the DUT 10. On the other hand, the contact pads 384 are disposed so as to correspond to second contact pins 412 of the socket 410.

When the DUT 10 is pressed against the socket 410 by the contact arm 300 during the test, the first terminals 12 of the DUT 10 come in contact with first contact pins 411 of the socket 410, and the second terminals 14 of the DUT 10 come in contact with the contact pins 383 of the relay socket 382. Further, the contact pads 384 of the relay socket 382 come in contact with the second contact pins 412 of the socket 410. As a result, the second terminals 14 of the DUT 10 are electrically connected to the socket 410 through the relay socket 382.

Note that, although not illustrated in particular, a temperature adjusting mechanism for controlling the temperature of the DUT 10, a temperature sensor for measuring the temperature of the DUT 10, and the like may be embedded in the holding part 380.

Figure 12:
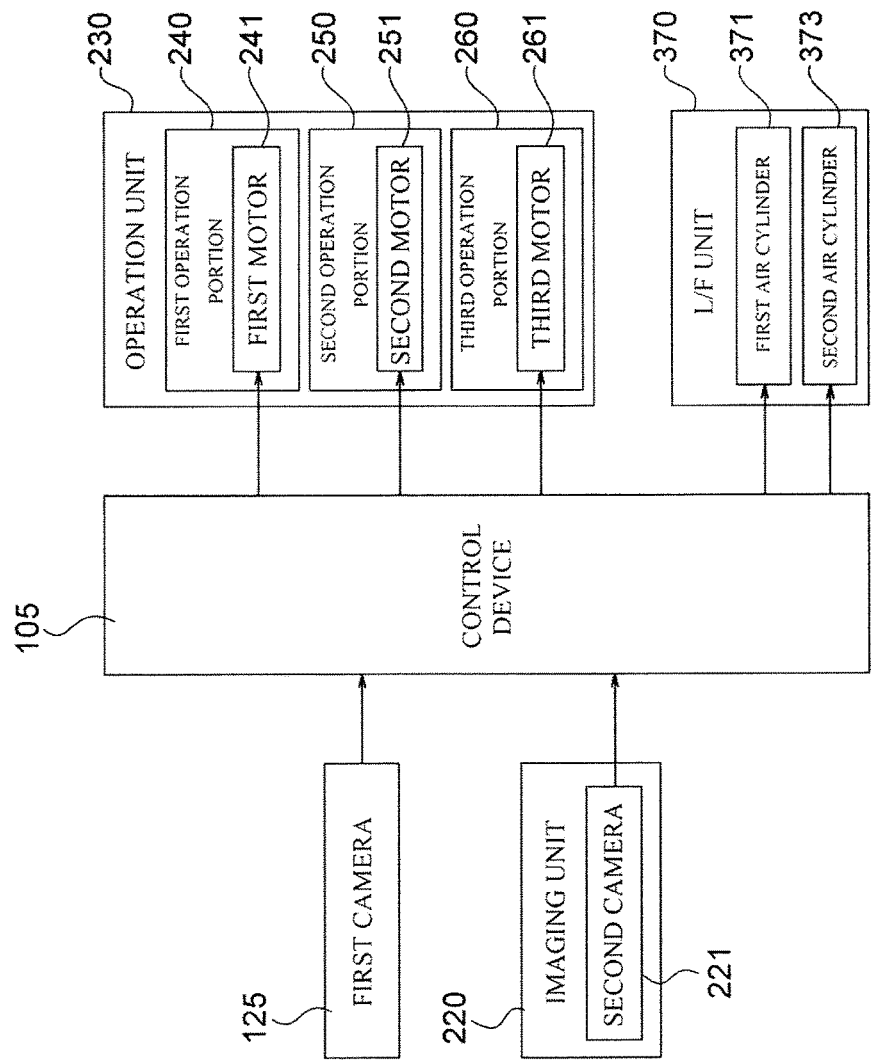
FIG. 12 is a block diagram illustrating a part of a control system of a handler in the embodiment of the present invention.

FIG. 12 is a block diagram illustrating a control system of the handler in the present embodiment.

As illustrated in FIG. 12, the imaging unit 220, the operation unit 230, and the lock and free unit 370 described above are connected to a control device 105 of the handler 100, and are controlled by the control device 105. Note that the control device 105 controls the entire handler 100. The control device 105 in the present embodiment is equivalent to an example of the calculation device in the present invention.

Specifically, the first camera 125 provided in the second transport device 120 can image the socket 410 of the test head 400 and then transmit the image information to the control device 105. Similarly, the second camera 221 of the imaging unit 220 can also image the DUT 10 placed on the first Y-direction buffer 160 or the relay socket 382 of the holding part 380 of the contact arm 300 and then transmit the image information to the control device 105.

The control device 105 includes, for example, a computer including a CPU, a RAM, a ROM, and the like, and has a function of performing image processing on image information. The control device 105 can recognize the position and orientation (hereinafter, also simply referred to as a "socket position") of the contact pins 411 and 412 of the socket 410 by performing image processing on the image information acquired by the first camera 125.

Note that, recognition of the socket position is performed, for example, when the socket 410 is replaced due to changes in the kind of the DUT 10 and the like. A step of imaging the socket 410 with the first camera 125 and recognizing the socket position is equivalent to an example of the (e) in the present invention. The socket position is used in step S34 of FIG. 13, which will be described later.

In addition, the control device 105 can recognize the position and orientation (hereinafter, also simply referred to as a "first terminal position") of the first terminals 12 of the DUT 10, the position and orientation (hereinafter, also simply referred to as a "second terminal position") of the second terminals 14 of the DUT 10, or the position and orientation (hereinafter, also simply referred to as a "relay socket position") of the contact pins 383 and the contact pads 384 of the relay socket 382 by performing image processing on image information acquired by the second camera 221.

Specifically, when the image information acquired by the second camera 221 is image information of the DUT 10 placed on the moving plate 162 of the first Y-direction buffer 160 (that is, the DUT 10 before being held by the contact arm 300), the control device 105 recognizes the second terminal position from the image information. The second terminal position is recognized in step S13 of FIG. 13, which will be described later, and is used in step S14 of FIG. 13.

On the other hand, when the image information acquired by the second camera 221 is image information of the holding part 380 before holding the DUT 10, the control device 105 recognizes the relay socket position from the image information. Note that, recognition of the relay socket position is performed, for example, when the relay socket 382 is replaced due to changes in the kind of the DUT 10 and the like. At this time, similarly to step S12 or S32 of FIG. 13 to be described later, a plurality of holding parts 380 are continuously imaged while moving the imaging unit 220 by the moving unit 210. A step of imaging the relay socket 382 with the second camera 221 and recognizing the relay socket position is equivalent to an example of the (h) in the present invention. The relay socket position is used in step S14 of FIG. 13, which will be described later.

Further, when the image information acquired by the second camera 221 is image information of the DUT 10 held by the holding part 380, the control device 105 recognizes the first terminal position from the image information. The first terminal position is recognized in step S33 of FIG. 13, which will be described later, and is used in step S34 of FIG. 13.

In addition, on the basis of the recognition result described above, the control device 105 can calculate the relative movement amount of the holding part 380 with respect to the base part 310, and can further calculate the amount of driving of the operation unit 230 for realizing the relative movement amount.

Specifically, when the contact arm 300 holds the DUT 10, the control device 105 calculates the relative movement amount for matching the second terminal position and the relay socket position relative to each other, and further calculates the amount of driving of the operation unit 230 for realizing the relative movement amount. Then, the first to third motors 241, 251, and 261 of the operation unit 230 operate by the amount of driving specified by the control device 105. As a result, the relay socket 382 is positioned relative to the DUT 10 (step S14 of FIG. 13 to be described later).

On the other hand, when the contact arm 300 presses the DUT 10 against the socket 410, the control device 105 calculates the relative movement amount for matching the socket position and the first terminal position relative to each other, and further calculates the amount of driving of the operation unit 230 for realizing the relative movement amount. Then, the first to third motors 241, 251, and 261 of the operation unit 230 operate by the amount of driving specified by the control device 105. As a result, the DUT 10 is positioned relative to the socket 410 (step S34 of FIG. 13 to be described later).

Next, a method of testing the DUT 10 using the alignment device 200 in the present embodiment will be described with reference to FIGS. 13 to 17.

Note that, although a method of testing the DUT 10 using the first movable head 122 will be described below, a method of testing the DUT 10 using the second movable head 123 is the same and accordingly explanation thereof will be omitted.

Figure 13:
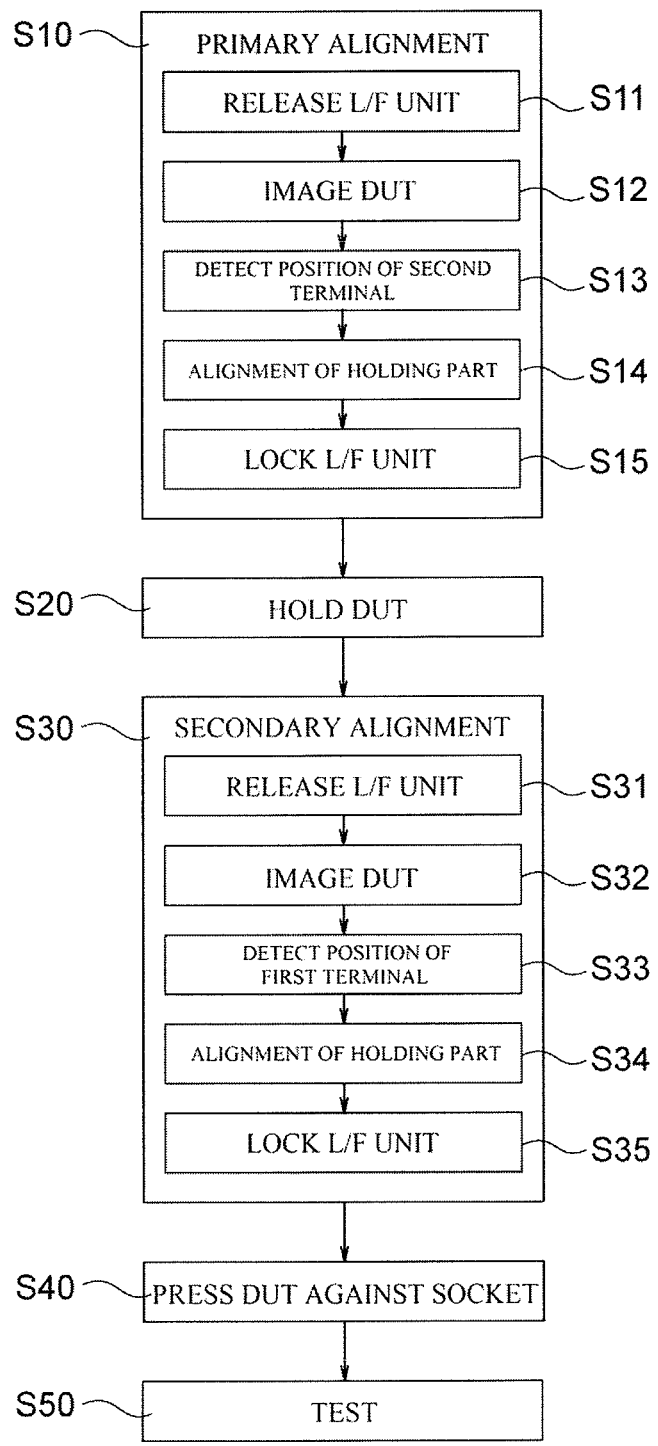
FIG. 13 is a flowchart illustrating an electronic component testing method in the embodiment of the present invention.
Figure 14:
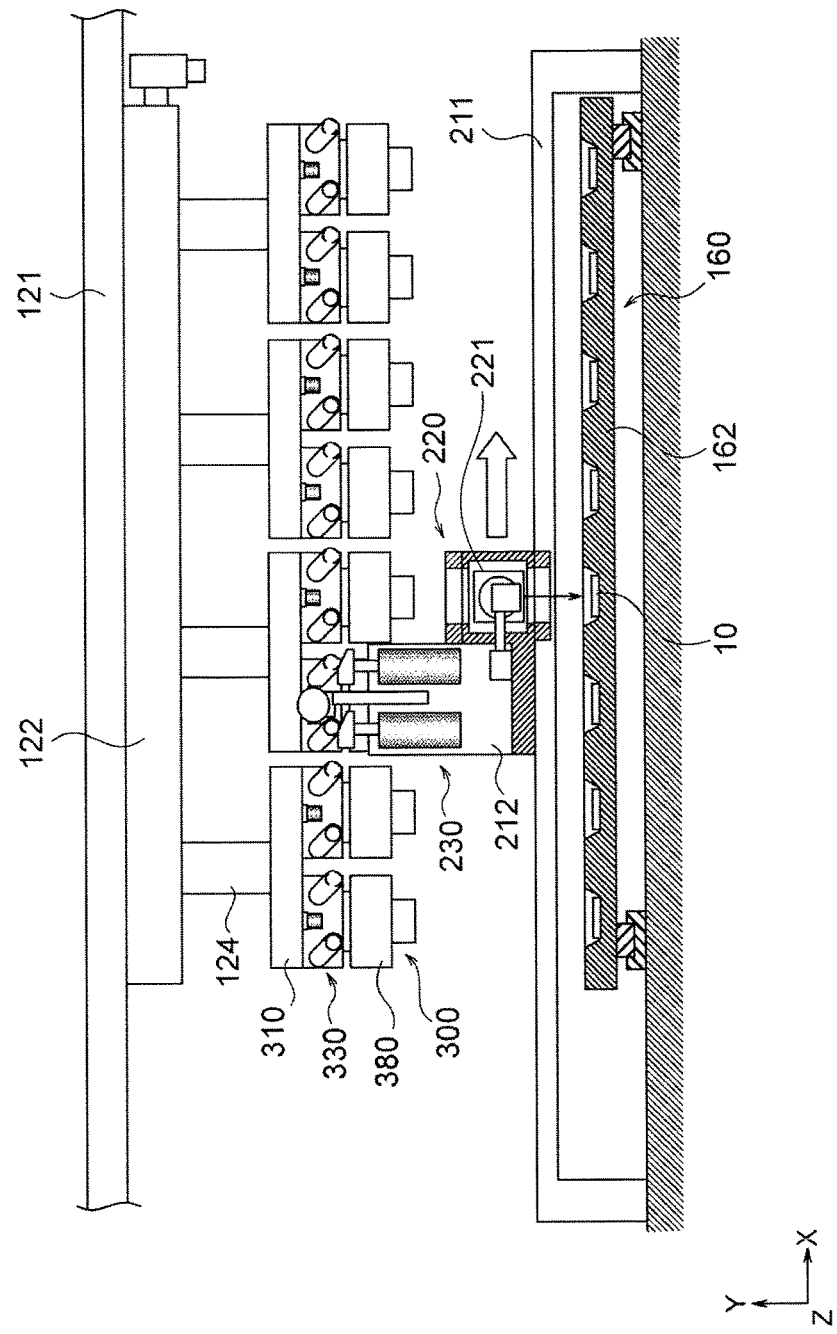
FIG. 14 is a diagram illustrating a contact arm and an alignment device in step S10 of FIG. 13.
Figure 15A:
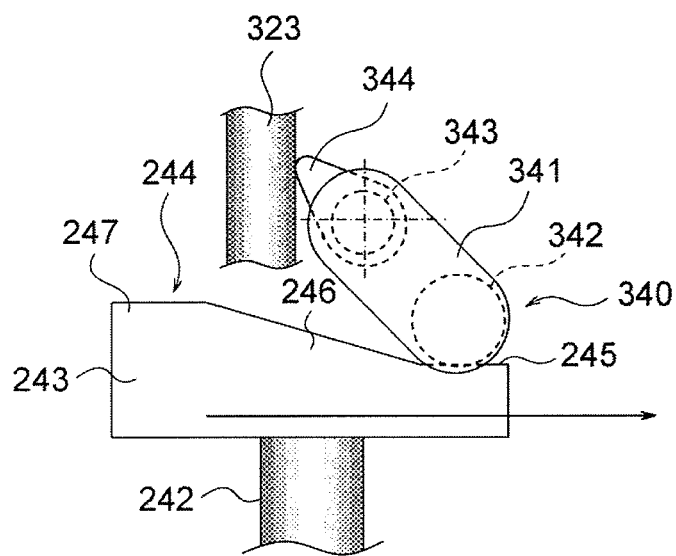
FIGS. 15A and 15B are enlarged views of an operation unit and an adjustment unit in step S14 of FIG. 13.
Figure 15B:
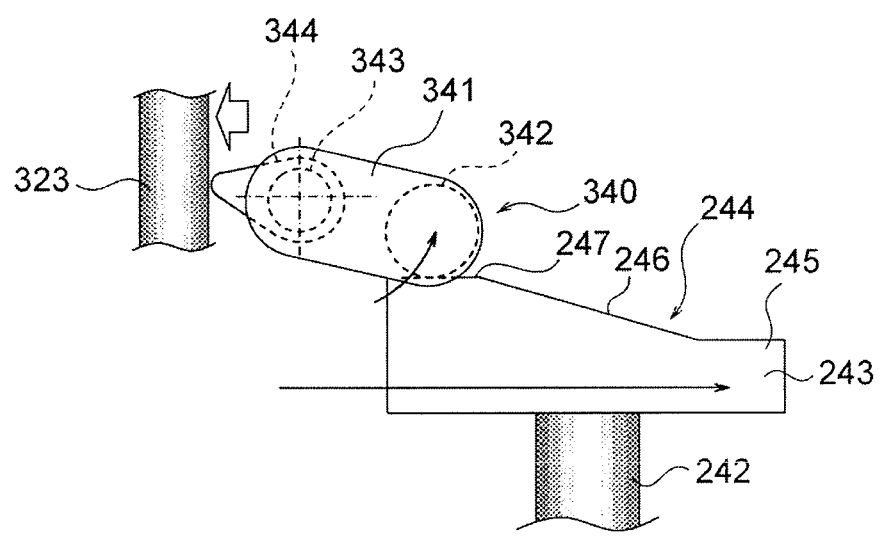
Figure 16:
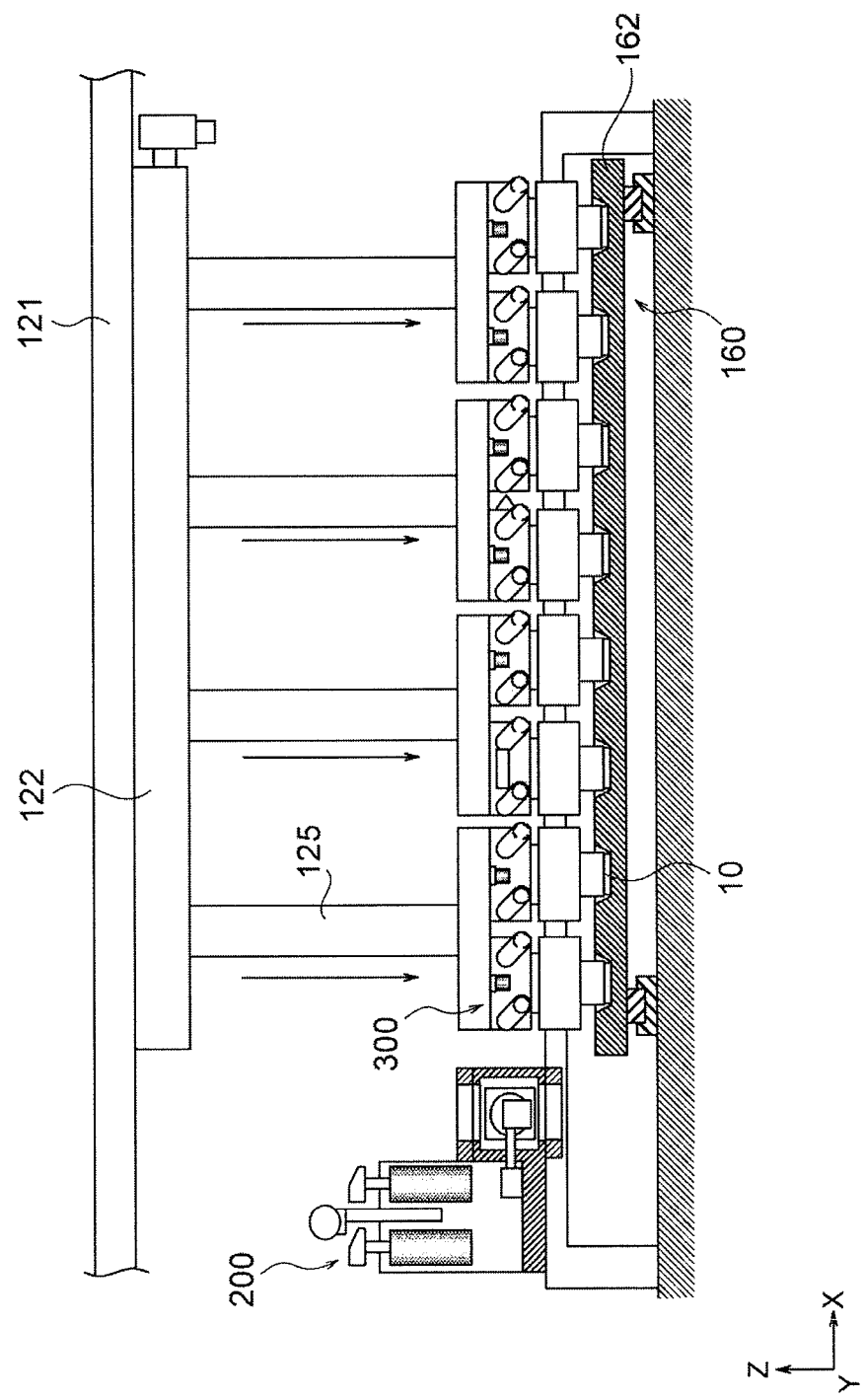
FIG. 16 is a diagram illustrating a contact arm and an alignment device in step S20 of FIG. 13.
Figure 17:
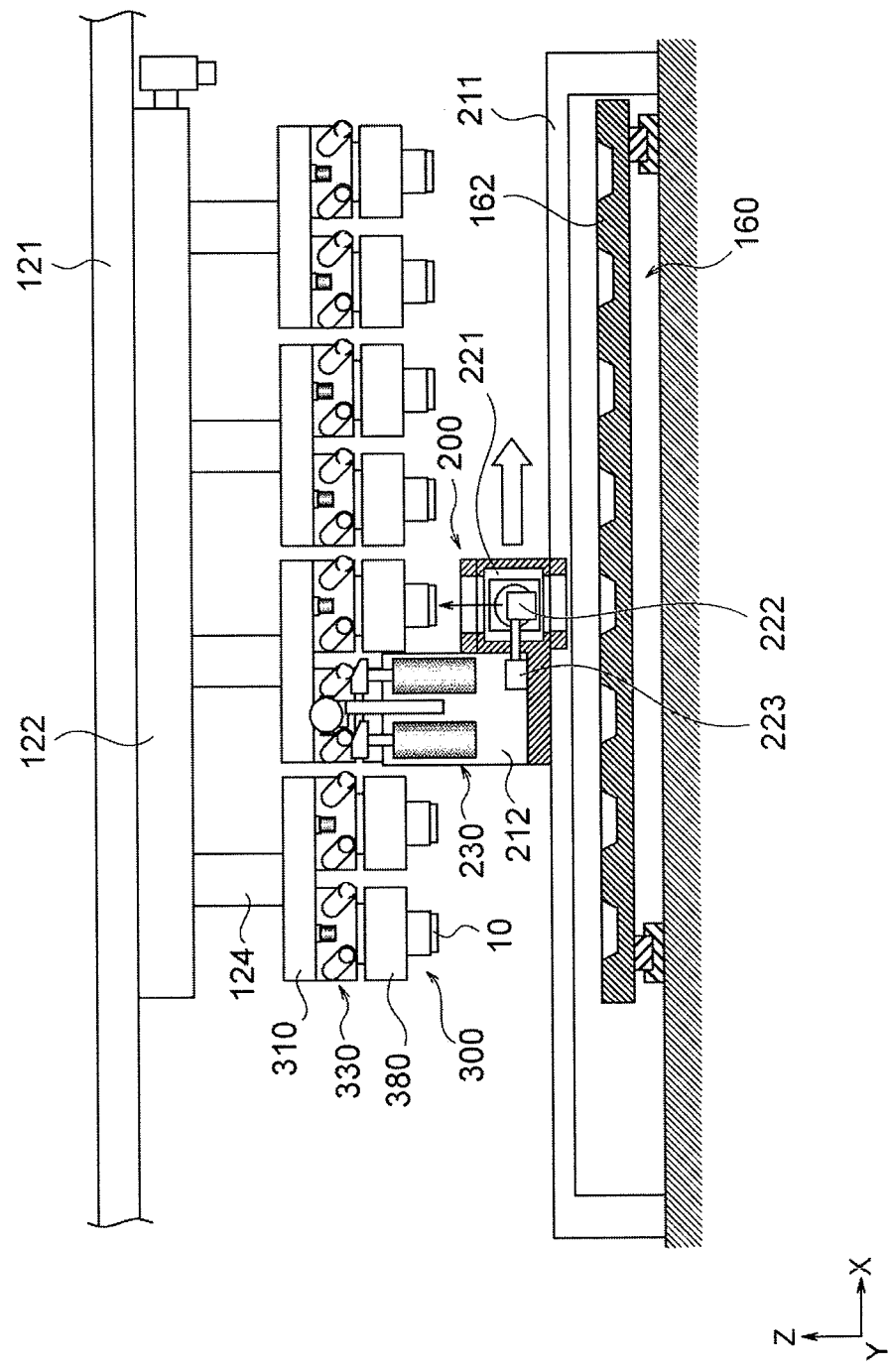
FIG. 17 is a diagram illustrating a contact arm and an alignment device in step S30 of FIG. 13.

FIG. 13 is a flowchart for describing the DUT testing method in the present embodiment. FIGS. 14, 16, and 17 are diagrams illustrating a contact arm and an alignment device in steps S10, S20, and S30 of FIG. 13. FIGS. 15A and 15B are enlarged views of an operation unit and an adjustment unit in step S14 of FIG. 13.

In the present embodiment, as illustrated in FIG. 13, the relay socket 382 is positioned relative to the DUT 10 in primary alignment S10, and then the DUT 10 is held by the contact arm 300 (step S20). Then, the DUT 10 is positioned relative to the socket 410 in secondary alignment S30, and then the DUT 10 is pressed against the socket 410 by the contact arm 300 (step S40). In this state, the test head 400 and the tester 500 test the DUT 10 (step S50).

Specifically, in step S11 of FIG. 13, the control device 105 releases all air cylinders 371 and 373 of the lock and free unit 370 to make the holding part 380 not restrained with respect to the base part 310.

Then, as illustrated in FIG. 14, steps S12 to S15 described below are performed while moving the slide portion 212 of the alignment device 200 along the X direction.

First, in step S12 of FIG. 13, the DUT 10 on the first Y-direction buffer 160 is imaged by the second camera 221 of the imaging unit 220.

Then, in step S13 of FIG. 13, the control device 105 recognizes the second terminal position by performing image processing on the image information.

Then, in step S14 of FIG. 13, the control device 105 calculates the amount of driving of the operation unit 230 on the basis of the second terminal position and the relay socket position recognized in advance, and gives an instruction regarding the amount of driving to the operation unit 230.

Then, the operation unit 230 operates the adjustment unit 330 in response to the instruction. For example, as illustrated in FIGS. 15A and 15B, when the first input lever 341 is pushed up by the inclined surface 246 of the first translating cam 243 in a state where the first translating cam 243 is positioned at a predetermined height by the first motor 241 on the basis of the instruction from the control device 105, the first strut 323 is pressed leftward in the drawings by the first plate cam 344.

Note that it is preferable that the operation unit 230 complete the instructed driving before the translating cams 243, 253, and 263 come in contact with the cam followers 342, 352, and 362 of the adjustment unit 330 according to the movement of the slide portion 212. However, the invention is not particularly limited thereto. At the latest, before the cam followers 342, 352, and 362 reach the second flat surfaces 247 of the translating cams 243, 253, and 263, the operation unit 230 may complete the instructed driving.

Then, in step S15 of FIG. 13, the floating unit 320 is locked by supplying air to the first air cylinder 371 of the lock and free unit 370. Thus, the relative positioning of the relay socket 382 with respect to the DUT 10 is completed.

Note that, in step S15, the first air cylinder 371 is locked while all cam followers 342, 352, and 362 of the adjustment unit 330 are rolling on the second flat surfaces 247 of the translating cams 243, 253, and 263.

In the present embodiment, since the processing of steps S12 to S15 is performed while moving the slide portion 212 as described above, it is possible to sequentially image a plurality of DUTs 10 using the second camera 221 and to sequentially operate a plurality of adjustment units 330 using the operation unit 230. For this reason, when the number of contact arms 300 is increased, it is possible to reduce the size of the handler 100 and to improve the throughput by shortening the time required for alignment work.

Further, in the present embodiment, the operation unit 230 operates the adjustment unit 330 using the movement of the slide portion 212 in the processing of steps S12 to S15. Therefore, it is also possible to simplify the configuration of the operation unit 230.

Then, in step S20 of FIG. 13, as illustrated in FIG. 16, the Z-direction actuator 124 extends to lower the contact arm 300 so that the contact arm 300 adsorbs and holds the DUT 10. Once the DUT 10 is adsorbed and held, the Z-direction actuator 124 is shortened to raise the contact arm 300.

Then, in step S31 of FIG. 13, the control device 105 releases the first air cylinder 371 of the lock and free unit 370 to make the holding part 380 not restrained with respect to the base unit 310.

Then, as illustrated in FIG. 17, steps S32 to S35 described below are performed while moving the slide portion 212 of the alignment device 200 along the X direction. Note that, before starting steps S32 to S35, the slide portion 212 of the alignment device 200 is returned in −X direction.

First, in step S32 of FIG. 13, the DUT 10 held by the holding part 380 is imaged by the second camera 221 of the imaging unit 220. Note that, before performing step S32, the air cylinder 223 of the imaging unit 220 is driven to rotate the mirror 222 by 90°.

Then, in step S33 of FIG. 13, the control device 105 recognizes the first terminal position by performing image processing on the image information.

Then, in step S34 of FIG. 13, the control device 105 calculates the amount of driving of the operation unit 230 on that basis of the first terminal position and the socket position recognized in advance, and gives an instruction regarding the amount of driving to the operation unit 230. In response to the instruction, the operation unit 230 operates the adjustment unit 330 in a manner similar to step S14 described above.

Then, in step S35 of FIG. 2, the floating unit 320 is locked by supplying air to the first air cylinder 371 of the lock and free unit 370. Thus, the relative positioning of the DUT 10 with respect to the socket 410 is completed.

Then, in step S40 of FIG. 2, although not illustrated in particular, the first movable head 122 moves above the socket 410 of the test head 400 and then the Z-direction actuator 124 extends to lower the first movable head 122 so that the DUT 10 is pressed against the socket 410.

Then, the first terminals 12 of the DUT 10 come in contact with the first contact pins 411 of the socket 410, and the second terminals 14 of the DUT 10 come in contact with the contact pins 383 of the relay socket 382. Further, the contact pads 384 of the relay socket 382 come in contact with the second contact pins 412 of the socket 410 (refer to FIG. 8). As a result, the second terminals 14 of the DUT 10 is electrically connected to the socket 410 through the relay socket 382.

Under this state, in step S50 of FIG. 2, the test head 400 and the tester 500 test the DUT 10 by inputting/outputting a test signal to the DUT 10.

After the test of the DUT 10 is completed, the Z-direction actuator 124 is shortened to raise the contact arm 300, and the first movable head 122 moves the DUT 10 to the first Y-direction buffer 160.

In the present embodiment, since the processing of steps S32 to S35 is performed while moving the slide portion 212 as described above, it is possible to sequentially image a plurality of DUTs 10 using the second camera 221 and to sequentially operate a plurality of adjustment units 330 using the operation unit 230. For this reason, when the number of contact arms 300 is increased, it is possible to reduce the size of the handler 100 and to improve the throughput by shortening the time required for alignment work.

Further, in the present embodiment, in the processing of steps S32 to S35, the operation unit 230 operates the adjustment unit 330 using the movement of the slide portion 212. Therefore, it is also possible to simplify the configuration of the operation unit 230.

Step S20 of FIG. 13 in the present embodiment is equivalent to an example of the (a) in the present invention, step S32 of FIG. 13 in the present embodiment is equivalent to an example of the (b) in the present invention, steps S33 and S34 of FIG. 13 in the present embodiment are equivalent to an example of the (c) in the present invention, and step S40 of FIG. 13 in the present embodiment is equivalent to an example of the (d) in the present invention.

Further, step S12 of FIG. 13 in the present embodiment is equivalent to an example of the (f) in the present invention, and steps S13 and S14 of FIG. 13 in the present embodiment are equivalent to an example of the (g) in the present invention.

Note that the embodiment described above is for making the invention easily understandable and are not intended to limit the invention. Accordingly, all kinds of design changes or equivalents within the technical range of the invention are also included in the respective elements disclosed in the above embodiment.

For example, although the processing of steps S12 to S15 is performed in parallel while moving the slide portion 212 in the testing method described above with reference to FIG. 13, the testing method of the invention is not particularly limited thereto. It is also possible to perform the processing of steps S12 and S13 for all DUTs 10 while moving the slide portion 212 and then perform the processing of steps S14 and S15 for all contact arms 300 while moving the slide portion 212 again.

Similarly, although the processing of steps S32 to S35 is performed in parallel while moving the slide portion 212 in the testing method described above, the testing method of the invention is not particularly limited thereto. It is also possible to perform the processing of steps S32 and S33 for all DUTs 10 while moving the slide portion 212 and then perform the processing of steps S34 and S35 for all contact arms 300 while moving the slide portion 212 again.

Further, although the example where the invention is applied to the handler 100 for testing the DUT 10, in which the terminals 12 and 14 are formed on both the surfaces 11 and 13, has been described in the above embodiment, the invention is not particularly limited thereto. For example, the invention may also be applied to a handler for testing a DUT in which a terminal is formed only on the bottom surface.

In this case, the holding part 380 may be centered with respect to the base part 310 by supplying air to the second air cylinder 373 before holding the DUT 10.

1 ELECTRONIC COMPONENT TESTING APPARATUS
100 HANDLER
105 CONTROL DEVICE
200 ALIGNMENT DEVICE
210 MOVING UNIT
212 SLIDE PORTION
220 IMAGING UNIT
221 SECOND CAMERA
222 MIRROR
223 AIR CYLINDER
230 OPERATION UNIT
240 FIRST OPERATION PORTION
241 FIRST MOTOR
242 FIRST SHAFT
243 FIRST TRANSLATING CAM
244 CAM SURFACE
245 FIRST FLAT SURFACE
246 INCLINED SURFACE
247 SECOND FLAT SURFACE
250 SECOND OPERATION PORTION
260 THIRD OPERATION PORTION
300 CONTACT ARM
310 BASE PART
320 FLOATING UNIT
323-325 FIRST TO THIRD STRUTS
330 ADJUSTMENT UNIT
340 FIRST ADJUSTMENT PORTION
341 FIRST INPUT LEVER
342 FIRST CAM FOLLOWER
343 FIRST SHAFT
344 FIRST PLATE CAM
345 FIRST SPRING
350 SECOND ADJUSTMENT PORTION
360 THIRD ADJUSTMENT PORTION
370 LOCK AND FREE UNIT
380 HOLDING PART
382 RELAY SOCKET
383 CONTACT PIN
384 CONTACT PAD
400 TEST HEAD
410 SOCKET
411 FIRST CONTACT PIN
412 SECOND CONTACT PIN
500 TESTER
10 DUT
12 FIRST TERMINAL
14 SECOND TERMINAL

What is claimed is:

1. An electronic component handling apparatus, comprising:
contact arms which are arrayed along a first direction, each of the contact arms including:
a base part;
a holding part which holds an electronic component;
an adjustment unit which moves the holding part relative to the base part; and
a restraint configured to restrain a relative movement of the holding part with respect to the base part or release the restraint of the relative movement;
an imaging unit which images at least one of the electronic component and the holding part;
a first moving device which moves the imaging unit along the first direction;
an operation unit which operates the adjustment unit; and
a second moving device which moves the operation unit along the first direction,
wherein:
the operation unit operates the adjustment unit in accordance with movement along the first direction by the second moving device, and
the adjustment unit adjusts a relative position of the holding part with respect to the base part according to an operation of the operation unit.

2. The electronic component handling apparatus according to claim 1, further comprising:
a calculation device which calculates a relative movement amount of the holding part with respect to the base part on the basis of image information imaged by the imaging unit,
wherein the operation unit operates the adjustment unit to move the holding part by the relative movement amount.

3. The electronic component handling apparatus according to claim 1, wherein
the first moving device and the second moving device are the same moving device, and
the imaging unit and the operation unit are provided in the moving device so as to be spaced apart from each other by a predetermined pitch along the first direction.

4. The electronic component handling apparatus according to claim 1, wherein
the adjustment unit includes:
an input part operated by the operation unit; and
an actuating part which performs planar movement and rotation of the holding part relative to the base part using a driving force input through the input part.

5. The electronic component handling apparatus according to claim 4, wherein
the operation unit includes:
first cams; and
driving parts which move the first cams independently along a direction substantially perpendicular to the first direction, and
the input part includes cam followers which follow the first cams.

6. The electronic component handling apparatus according to claim 5, wherein
each of the first cams includes:
a first cam surface inclined with respect to the first direction; and
a flat second cam surface extending in a direction opposite to the first direction from an end of the first cam surface.

7. The electronic component handling apparatus according to claim 5, wherein the actuating part includes:

a pressing piece connected to the cam follower; and
a pressure receiving part which is fixed to the holding part and is pressed by the pressing piece.

8. The electronic component handling apparatus according to claim 7, wherein the pressing piece includes a second cam connected to the cam follower through a shaft.

9. The electronic component handling apparatus according to claim 7, wherein the actuating part includes a biasing device which biases the holding part in a direction in which the pressure receiving part is in contact with the pressing piece.

10. The electronic component handling apparatus according to claim 1, wherein the imaging unit includes:
   a single imaging device; and
   a switching device which switches a direction of an optical axis of the imaging device to a direction toward the electronic component or the holding part.

11. The electronic component handling apparatus according to claim 10, wherein the electronic component includes:
   a first terminal provided on one main surface; and
   a second terminal provided on the other main surface,
   the holding part includes an intermediate socket in contact with the second terminal, and
   the imaging unit images
   the electronic component placed at a predetermined position,
   the holding part before holding the electronic component, and
   the electronic component held by the holding part.

12. An electronic component testing apparatus which tests an electronic component, comprising:
   the electronic component handling apparatus according to claim 1;
   a test head having a socket electrically connected to the electronic component; and
   a tester electrically connected to the test head,
   wherein the contact arm presses the electronic component against the socket.

13. An electronic component handling apparatus, comprising:
   a contact arm which includes:
      a base part;
      a holding part configured to hold an electronic component;
      an adjustment unit configured to move the holding part relative to the base part; and
      a restraint configured to restrain a relative movement of the holding part with respect to the base part or release the restraint of the relative movement;
   an imaging unit which images the electronic component and the holding part; and
   an operation unit which operates the adjustment unit,
   wherein:
      the imaging unit includes:
         a single imaging device; and
         a switching device which switches a direction of an optical axis of the imaging device to a direction toward the electronic component or the holding part, and
      the adjustment unit adjusts a relative position of the holding part with respect to the base part according to an operation of the operation unit.

14. An electronic component testing apparatus which tests an electronic component, comprising:
   the electronic component handling apparatus according to claim 13;
   a test head having a socket electrically connected to the electronic component; and
   a tester electrically connected to the test head,
   wherein the contact arm presses the electronic component against the socket.

* * * * *